United States Patent
Peng et al.

(10) Patent No.: US 9,070,827 B2
(45) Date of Patent: Jun. 30, 2015

(54) OPTOELECTRONIC DEVICE AND METHOD FOR MANUFACTURING THE SAME

(71) Applicants: Wei Chih Peng, Hsinchu (TW); Shih Te Pai, Hsinchu (TW)

(72) Inventors: Wei Chih Peng, Hsinchu (TW); Shih Te Pai, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 120 days.

(21) Appl. No.: 13/967,193

(22) Filed: Aug. 14, 2013

(65) Prior Publication Data

US 2013/0328102 A1   Dec. 12, 2013

Related U.S. Application Data

(63) Continuation-in-part of application No. 13/225,117, filed on Sep. 2, 2011, now Pat. No. 8,519,430, which is a continuation-in-part of application No. 13/178,323, filed on Jul. 7, 2011, now Pat. No. 8,344,409.

(30) Foreign Application Priority Data

Oct. 29, 2010   (TW) ............................... 99137445 A
Jan. 19, 2011   (TW) ............................... 100102057 A

(51) Int. Cl.
*H01L 33/00* (2010.01)
*H01L 33/32* (2010.01)
*H01L 33/16* (2010.01)
*H01L 33/22* (2010.01)
*H01L 33/30* (2010.01)
*H01L 31/075* (2012.01)
*H01L 31/054* (2014.01)
*H01L 33/12* (2010.01)
*H01L 33/46* (2010.01)

(52) U.S. Cl.
CPC ............ *H01L 33/32* (2013.01); *H01L 33/0066* (2013.01); *H01L 33/12* (2013.01); *H01L 33/16* (2013.01); *H01L 33/22* (2013.01); *H01L 33/46* (2013.01); *H01L 33/305* (2013.01); *H01L 31/075* (2013.01); *H01L 31/0543* (2014.12); *H01L 31/0547* (2014.12); *Y02E 10/52* (2013.01); *Y02E 10/548* (2013.01)

(58) Field of Classification Search
CPC ............ H01L 29/66462; H01L 29/778; H01L 31/03048
USPC .............. 257/98, 79, 103, E33.068, E33.008; 438/29, 46, 47
See application file for complete search history.

(56) References Cited

U.S. PATENT DOCUMENTS

| | | |
|---|---|---|
| 5,526,449 A | 6/1996 | Meade |
| 6,859,477 B2 | 2/2005 | Deppe |
| 6,918,946 B2 | 7/2005 | Korgel |
| 7,567,342 B2 | 7/2009 | Reinhold |

(Continued)

FOREIGN PATENT DOCUMENTS

| | | |
|---|---|---|
| CN | 1653624 A | 8/2005 |
| CN | 100428510 C | 10/2008 |
| TW | 535300 | 3/2001 |

*Primary Examiner* — David Vu
(74) *Attorney, Agent, or Firm* — Muncy, Geissler, Olds & Lowe, P.C.

(57) ABSTRACT

An optoelectronic device comprising: a substrate; and an epitaxial stack including a first semiconductor layer having a first conductivity-type impurity, an active layer, and a second semiconductor layer having a second conductivity-type impurity formed in sequence on the substrate; a hollow component formed inside the active layer or the second semiconductor layer, wherein the layer with the hollow component is doped with an additional impurity.

20 Claims, 20 Drawing Sheets

(56) References Cited

U.S. PATENT DOCUMENTS

| | | |
|---|---|---|
| 8,123,859 B2 | 2/2012 | Schowalter |
| 8,248,305 B2 | 8/2012 | Curran |
| 2009/0278233 A1 | 11/2009 | Pinnington |
| 2010/0047522 A1 | 2/2010 | Sivarajan |
| 2010/0135937 A1 | 6/2010 | O'Brien |
| 2010/0278720 A1 | 11/2010 | Wong |
| 2011/0095342 A1 | 4/2011 | Daniel |
| 2012/0132930 A1 | 5/2012 | Young |

OPTOELECTRONIC DEVICE AND METHOD FOR MANUFACTURING THE SAME

RELATED APPLICATION

This application is a continuation-in-part of U.S. patent application Ser. No. 13/225,117, entitled "OPTOELECTRONIC DEVICE AND METHOD FOR MANUFACTURING THE SAME", filed Sep. 2, 2011, now pending, the entire content of which is incorporated herein by reference in its entirety.

BACKGROUND

1. Technical Field

The present disclosure relates to an optoelectronic device having a transition stack formed between the semiconductor layer and the substrate.

2. Description of the Related Art

The light radiation theory of light emitting diode (LED) is to generate light from the energy released by the electron moving between the n-type semiconductor and the p-type semiconductor. Because the light radiation theory of LED is different from the incandescent light which heats the filament, the LED is called a "cold" light source. Moreover, the LED is more sustainable, longevous, light and handy, and less power consumption, therefore it is considered as a new light source for the illumination markets. The LED applies to various applications like the traffic signal, backlight module, street light, and medical instruments, and is gradually replacing the traditional lighting sources.

Generally, the light extraction efficiency depends on the internal quantum efficiency and light extraction efficiency. The internal quantum efficiency can be defined as the opto-electrical conversion efficiency in the LED.

FIG. 5A illustrates the structure of a conventional light emitting device 10 which includes a transparent substrate 10, a buffer layer 1, a semiconductor stack layer 12 formed above the transparent substrate 10, and an electrode 14 formed above the semiconductor stack layer 12, wherein the semiconductor stack layer 12 comprises, from the top, a first conductive-type semiconductor layer 120, an active layer 122, and a second conductive-type semiconductor layer 124. At least one void 111 is formed inside the buffer layer 11.

However, as shown in the FIG. 5B, the conventional light emitting device 100 has a gray surface because of the void 111 inside the buffer layer 11, and the light transmission is decreased.

SUMMARY OF THE DISCLOSURE

An optoelectronic device comprising: a substrate; an epitaxial stack including a first semiconductor layer having a first conductivity-type impurity, an active layer, and a second semiconductor layer having a second conductivity-type impurity formed on the substrate; and a hollow component formed inside the active layer or the second semiconductor layer, wherein the layer with the hollow component is doped with an additional impurity.

A method of fabricating am optoelectronic device, including: providing a substrate; forming a first semiconductor layer having a first conductivity-type impurity on the substrate; forming an active layer on the first semiconductive layer; forming a second semiconductive layer having a second conductivity-type impurity; doping an additional impurity into at least one of the second semiconductor layer and the active layer; and forming a hollow component inside the second semiconductor layer and/or the active layer.

BRIEF DESCRIPTION OF DRAWINGS

The accompanying drawings are included to provide easy understanding of the application, and are incorporated herein and constitute a part of this specification. The drawings illustrate embodiments of the application and, together with the description, serve to illustrate the principles of the application.

DETAILED DESCRIPTION OF THE PREFERRED EMBODIMENTS

Figure 1A:
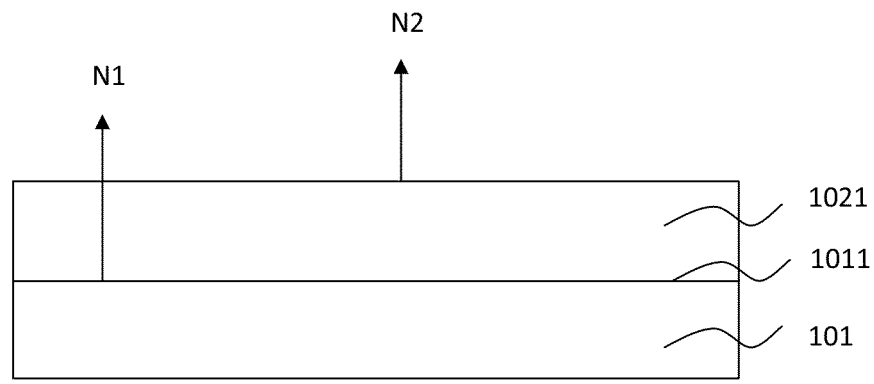
FIGS. 1A-1B and 1D-1G illustrate a process flow of a method of fabricating an optoelectronic device of the first embodiment in the present disclosure.

Reference is made in detail to the preferred embodiments of the present application, examples of which are illustrated in the accompanying drawings. Wherever possible, the same reference numbers are used in the drawings and the description to refer to the same or like parts.

The present disclosure describes an optoelectronic device and a method of fabricating the optoelectronic device. In order to have a thorough understanding of the present disclosure, please refer to the following description and the illustrations.

FIGS. 1A to 1F illustrate a process flow of the method of fabricating the optoelectronic device of first embodiment of the present disclosure. FIG. 1A shows a substrate 101 having a normal direction N1 and a first major surface 1011. A first transition layer 1021 is formed on the first surface 1011 of the substrate 101 and has a normal direction N2 wherein the thickness of the first transition layer 1021 can be 0.3-3 μm, 0.4-3 μm, 0.5-3 μm, 0.7-3 μm, 1-3 μm, or 2-3 μm.

In this embodiment, the material of the first transition layer 1021 contains at least one element selected from the group consisting of Al, Ga, In, As, P, and N, such as GaN or AlGaInP. In one embodiment, the first transition layer 1021 can be an n-type doped layer: the doping concentration can be 1E15–1E19 cm$^{-3}$, 1E16–1E19 cm$^{-3}$, 1E17–1E19 cm$^{-3}$, 1E18–1E19 cm$^{-3}$, 5×1E18–1E9 cm$^{-3}$, 5×1E17–1E19 cm$^{-3}$, or 5×1E17–1E18 cm$^{-3}$.

Figure 1B:
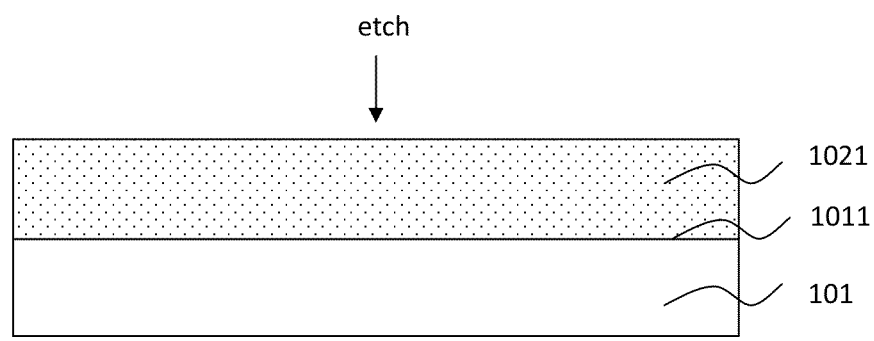

Following, as FIG. 1B shows, the first transition layer 1021 can be etched by the following method to form at least one hollow component such as pore, void, bore, pinhole, cavity, or at least two hollow components that can link into a mesh or porous structure.

The methods include: 1) Wet etching with an aqueous solution of at least one of $H_2SO_4$, $H_3PO_4$, $H_2C_2O_4$, HCl, KOH, and NaOH, ethylene glycol solution, or their mixture;

2) Electrochemical etching with an aqueous solution of at least one of $HzSO_4$, $H_3PO_4$, $H_2C_2O_4$, HCl, KOH, and NaOH, an ethylene glycol solution, or their mixture; or 3) Dry etching such as inductive coupling plasma (ICP), reactive ion etch (RIE) by a gas containing at least one of HCl, $Cl_2$, $SF_6$, $H_2$, $BCl_3$, and $CH_4$.

Figure 1C:
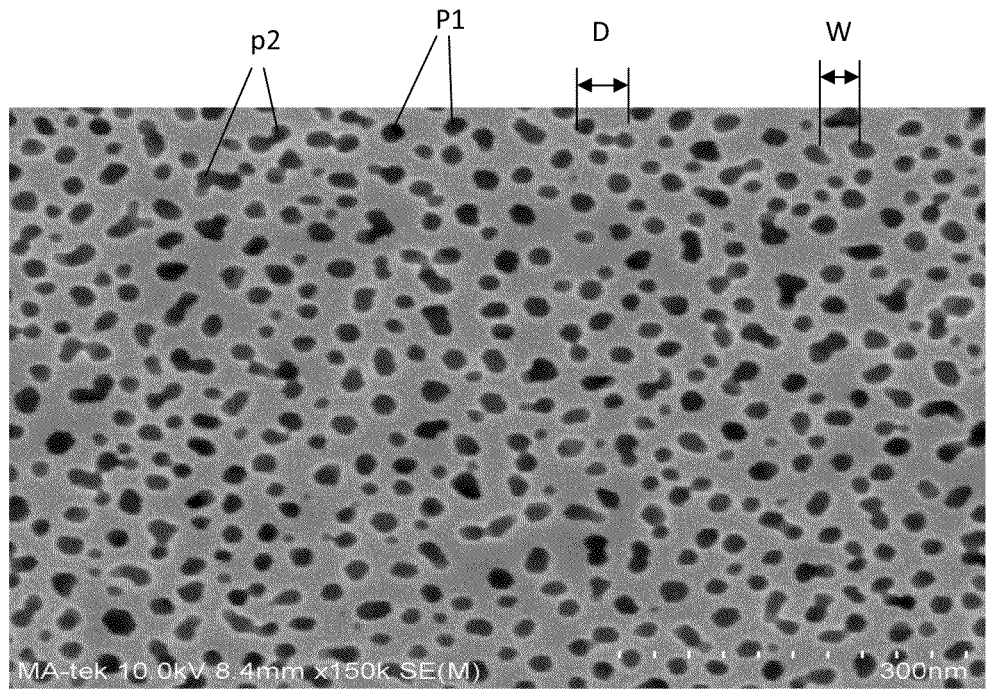
FIGS. 1C and 1H illustrate scanning electron microscope (SEM) pictures of the first embodiment in the present disclosure.

FIG. 1C illustrates a scanning electron microscope (SEM) picture of the first embodiment of the present disclosure which shows the top view of the first transition layer 1021. The first transition layer 1021 has a plurality of hollow components p1 or a plurality of mesh or porous structures p2 formed inside the first transition layer 1021 wherein the plurality of hollow components p1 can have the same or different width W.

In this embodiment, the width W of the hollow component is defined as the largest size of the hollow component p1 perpendicular to the normal direction N2 of the first transition layer 1021. The width W of the hollow component p1 inside the first transition layer 1021 can be 10 nm-2000 nm, 100 nm-2000 nm, 300 nm-2000 nm, 500 nm-2000 nm, 800 nm-2000 nm, 1000 nm-2000 nm. 1300 nm-2000 nm, 1500 nm-2000 nm, or 1800 nm-2000 nm. In one embodiment, the width W of the hollow component p1 close to the substrate is larger than the width of the hollow component p1 close to the second transition layer 1022.

The average distance D between any two of the hollow components p1 can be 10 nm-2000 nm, 100 nm-2000 nm, 300 nm-2000 nm, 500 nm-2000 nm, 800 nm-2000 nm, 1000 nm-2000 nm, 1300 nm-2000 nm, 1500 nm-2000 nm, or 1800 nm-2000 nm.

In another embodiment, the plurality of hollow components p1 inside the first transition layer 1021 forms a regular array structure. The average width W of the plurality of hollow components p1 can be 10 nm-2000 nm, 100 nm-2000 nm, 300 nm-2000 nm. 500 nm-2000 nm, 800 nm-2000 nm, 1000 nm-2000 nm, 1300 nm-2000 nm, 1500 nm-2000 nm, or 1800 nm-2000 nm.

The porosity Φ of the plurality of hollow components p1 is defined as the total volume of the hollow components $V_v$ divided by the overall volume $V_T$ of the first transition layer 1021

$$\left(\phi = \frac{V_V}{V_T}\right).$$

In this embodiment, the porosity Φ can be 5%-90%, 10%-90%, 20%-90%. 30%-90%, 40%-90%, 50%-90%, 60%-90%, 70%-90% or 80%-90%.

Figure 1D:
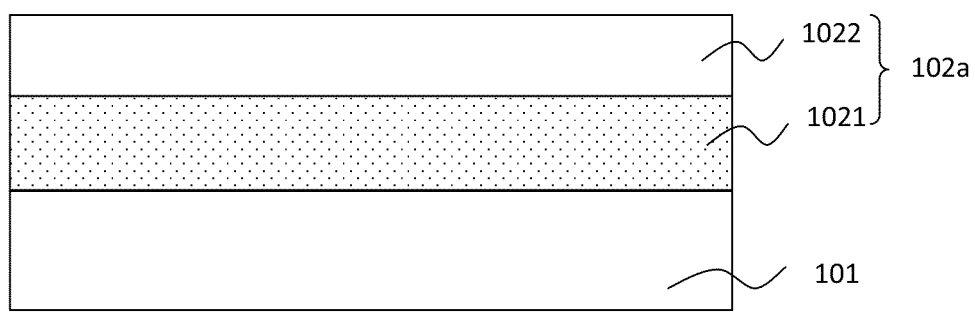

Following, as FIG. 1D shows, a second transition layer 1022 is formed on the first transition layer 1021 wherein the first transition layer 1021 and the second transition layer 1022 form a first transition stack 102a. The growing temperature of the second transition layer 1022 can be 800-1200° C., and the pressure can be 100-700 mbar, wherein the adjustment of the growing condition is based on the porosity and volume of the hollow component of the first transition layer 1021. The second transition layer 1022 is laterally grown and coalesced on the first transition layer 1021 by decreasing the volume of the hollow component between the interface of the first transition layer 1021 and the second transition layer 1022 and continues to grow vertically. In one embodiment, the second transition layer 1022 is an unintentional doped layer or an undoped layer.

Figure 1E:
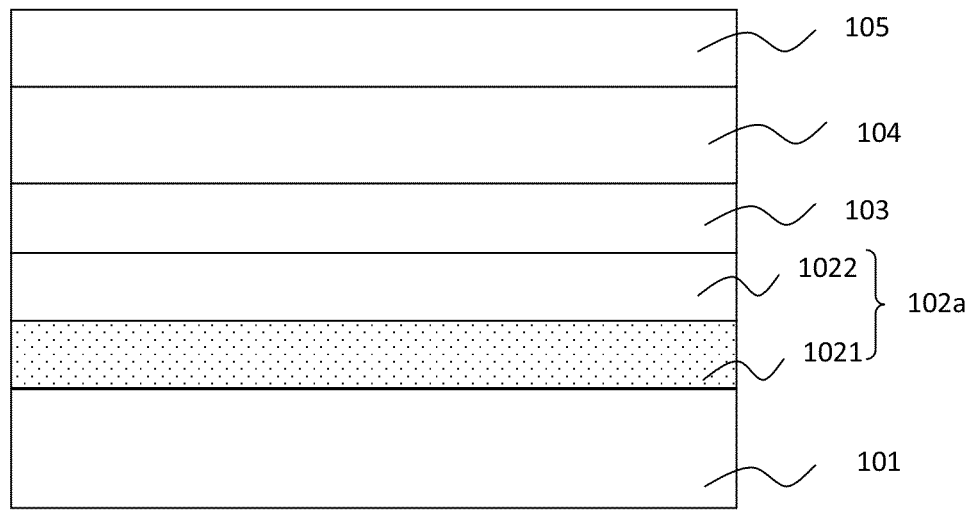
Figure 1F:
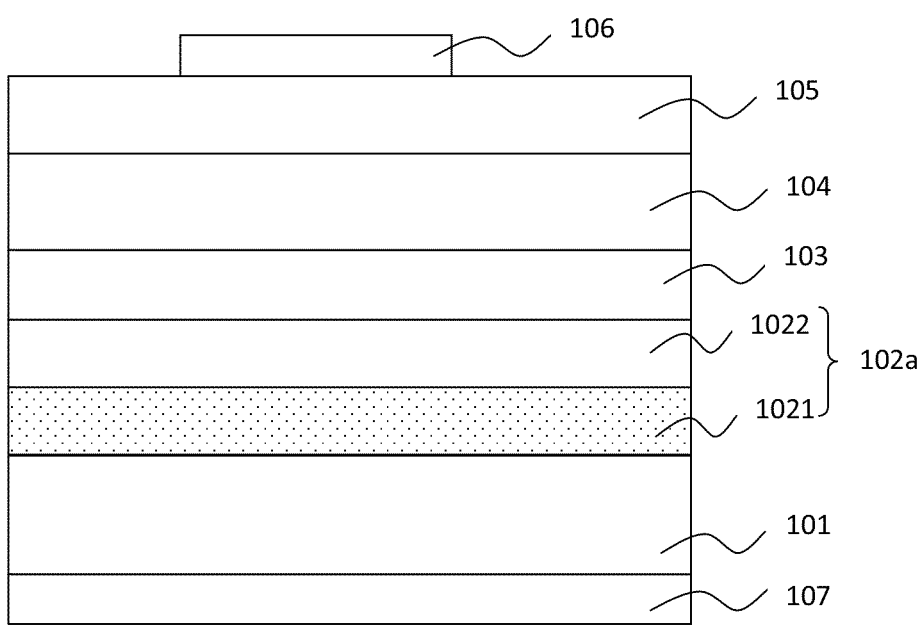

Following, as FIG. 1E shows, a first conductivity semiconductor layer 103, an active layer 104, and a second conductivity semiconductor layer 105 are formed on the second transition layer 1022 subsequently. Finally, as shown in FIG. 1F, two electrodes 106, 107 are formed on the second conductivity semiconductor layer 105 and the substrate 101 respectively to form a vertical type optoelectronic device 100.

Figure 1G:
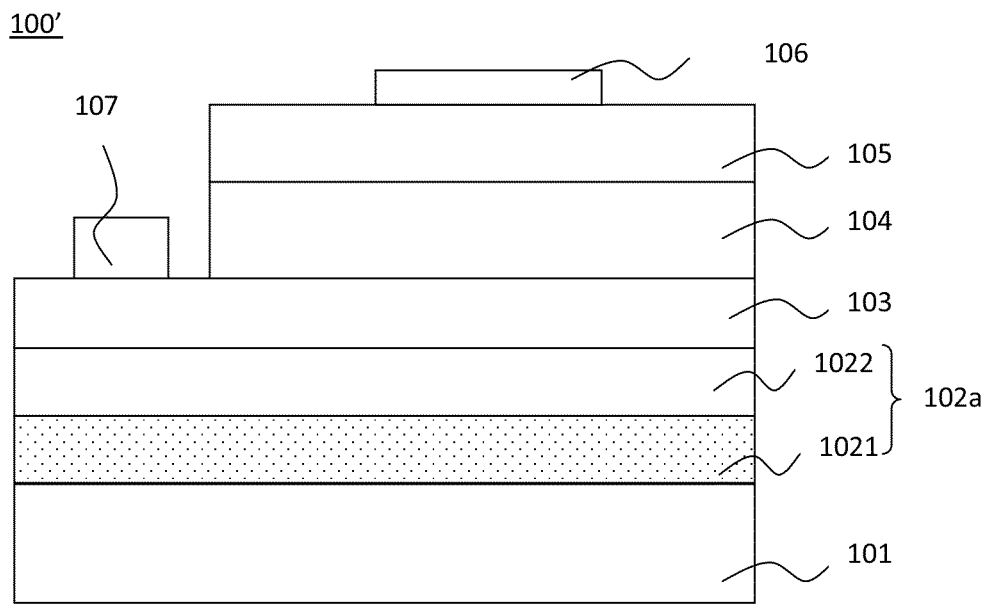

In one embodiment, as shown in FIG. 1G, partial of the active layer 104 and the second conductivity semiconductor layer 105 is etched to expose partial of the first conductivity semiconductor layer 103. Two electrodes 106, 107 are formed on the second conductivity semiconductor layer 105 and the first conductivity semiconductor layer 103 respectively to form a horizontal type optoelectronic device 100'. The material of the electrode 106, 107 can be Cr, Ti, Ni, Pt, Cu, Au, Al, or Ag.

In one embodiment, the optoelectronic device 100' can be bonded on a submount to form a flip-chip structure.

Figure 1H:
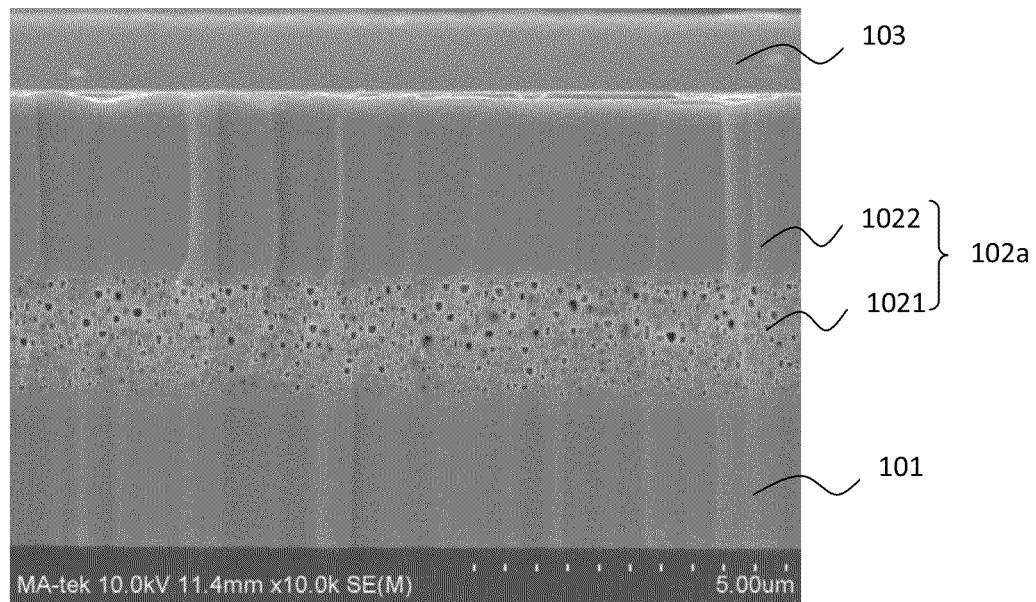

FIG. 1H illustrates a scanning electron microscope (SEM) picture of the first embodiment of the present disclosure which shows the substrate 101, the first transition layer 1021, the second transition layer 1022 and the first conductivity semiconductor layer 103. In one embodiment, the width W of the hollow component inside the first transition layer 1021 is decreased along the direction from the substrate 101 to the second transition layer 1022.

The plurality of the hollow components inside the first transition layer 1021 having a refractive index. Because of the difference of the refractive index of the plurality of the hollow components and the semiconductor layer, for example, the refractive index of the semiconductor layer is 2-3, and the refractive index of air is 1 so the light transmitting into the plurality of the hollow components changes its emitting direction to outside the optoelectronic device and increases the light emitting efficiency. Besides, the plurality of the hollow components can be a scattering center to change the direction of the photon and decrease the total reflection. By increasing the porosity of the hollow component, the effect mentioned above is increasing.

The second transition layer 1022 can be an unintentional doped layer or an undoped layer. The second transition layer 1022 is laterally grown and coalesced on the first transition layer 1021 by decreasing the volume of the hollow component formed between the interfaces of the first transition layer 1021 and the second transition layer 1022 and continues to epitaxial grow vertically. The second transition layer 1022 can avoid the absorption of the doping material such as Si or Mg into the hollow component from the doped n-type or p-type semiconductor layer, and the transmittance and the light extraction efficiency is therefore increased.

FIGS. 2A to 2H illustrate the structure of another optoelectronic device of the second embodiment in the present disclosure.

Figure 2A:
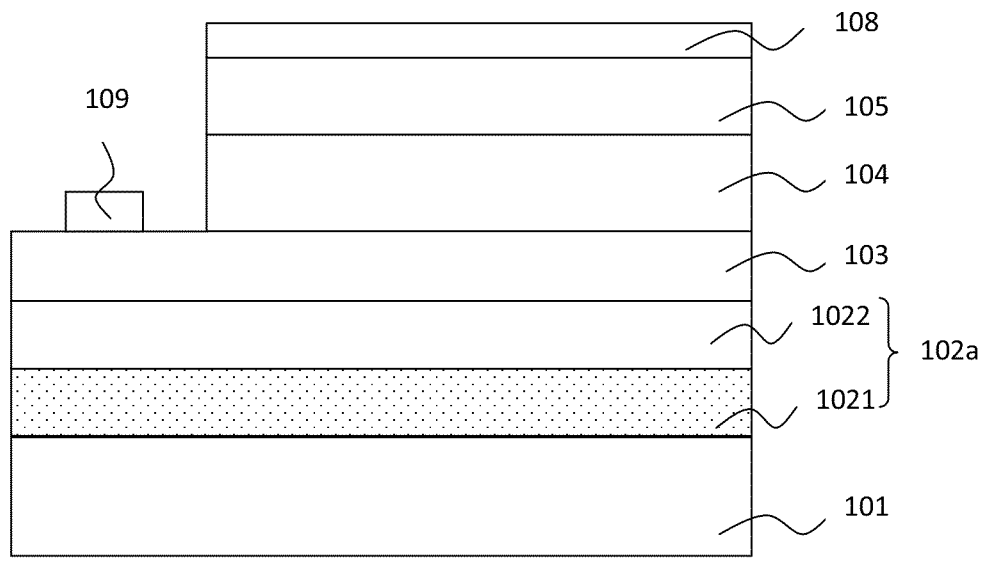
FIGS. 2A to 2H illustrate the structure of another optoelectronic device of the second embodiment in the present disclosure.

As FIG. 2A shows, following the process shown in FIG. 1E, partial of the active layer 104 and the second conductivity semiconductor layer 105 is etched to expose partial of the first conductivity semiconductor layer 103. In this embodiment, the first conductivity semiconductor layer 103 is n-type doped layer and the second conductivity semiconductor layer 105 is p-type doped layer. Following, a second n-type doped layer 108 is formed on the second conductivity semiconductor layer 105, and a passivation layer 109 is formed on partial of the exposed first conductivity semiconductor layer 103. In this embodiment, the material of the second n-type doped layer 108 contains at least one element selected from the group consisting of Al, Ga, In, As, P, and N, such as GaN, AlGaInP or any other suitable materials. In this embodiment, the doping concentration of the first conductivity semiconductor layer 103 and the second n-type doped layer 108 can be $1E15-1E19$ $cm^{-3}$, $1E16-1E19$ $cm^{-3}$, $1E17-1E19$ $cm^{-3}$, $1E18-1E19$ $cm^{-3}$, $5\times1E18-1E19$ $cm^{-3}$, $5\times1E17-1E19$ $cm^{-3}$, or $5\times1E17-1E18$ $cm^{-3}$.

Figure 2B:
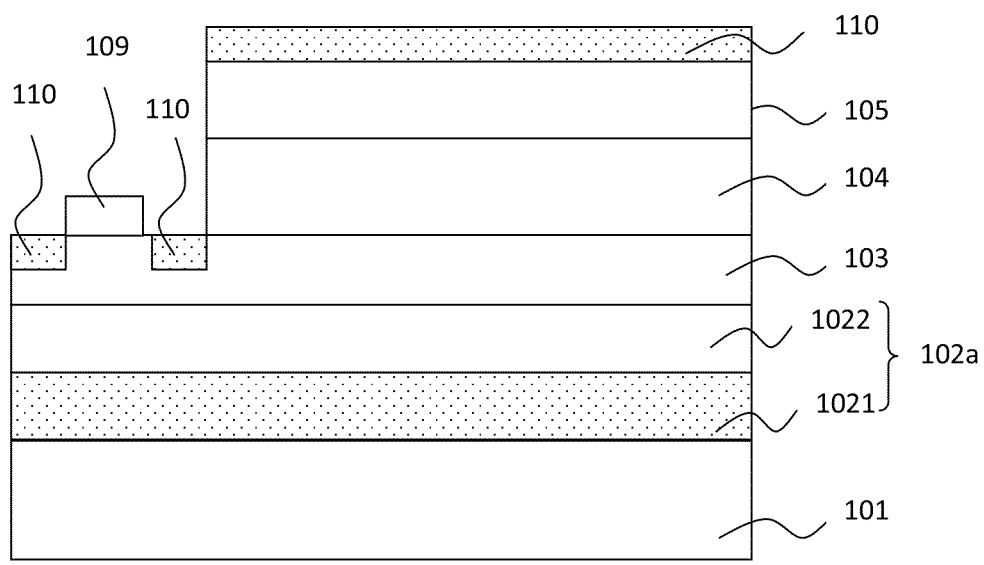

Following, as FIG. 2B shows, the exposed part of the first conductivity semiconductor layer 103 which is not covered by the passivation layer 109 can be etched by the following method to form at least one reflecting layer 110 wherein the reflecting layer 110 includes at least one hollow component such as pore, void, bore, pinhole, cavity, or at least two hollow components that can link into a mesh or porous structure. Besides, the second n-type doped layer 108 can be etched by the following method to form at least one hollow component such as pore, void, bore, pinhole, cavity, or at least two hollow components that can link into a mesh or porous structure. In one embodiment, the partial of the first conductivity semiconductor layer 103 and the second n-type doped layer 108 can be etched at the same time with the same etching condition or can be etched separately.

The etching methods include: 1) Wet etching with an aqueous solution of at least one of $H_2SO_4$, $H_3PO_4$, $H_2C_2O_4$, HCl, KOH, and NaOH, ethylene glycol solution, or their mixture;

2) Electrochemical etching with an aqueous solution of at least one of $H_2SO_4$, $H_3PO_4$, $H_2C_2O_4$, HCl, KOH, and NaOH, an ethylene glycol solution, or their mixture; or 3) Dry etching such as inductive coupling plasma (ICP), reactive ion etch (RIE) by a gas containing at least one of HCl, $Cl_2$, $SF_6$, $H_2$, $BCl_3$, and $CH_4$.

Figure 2C:
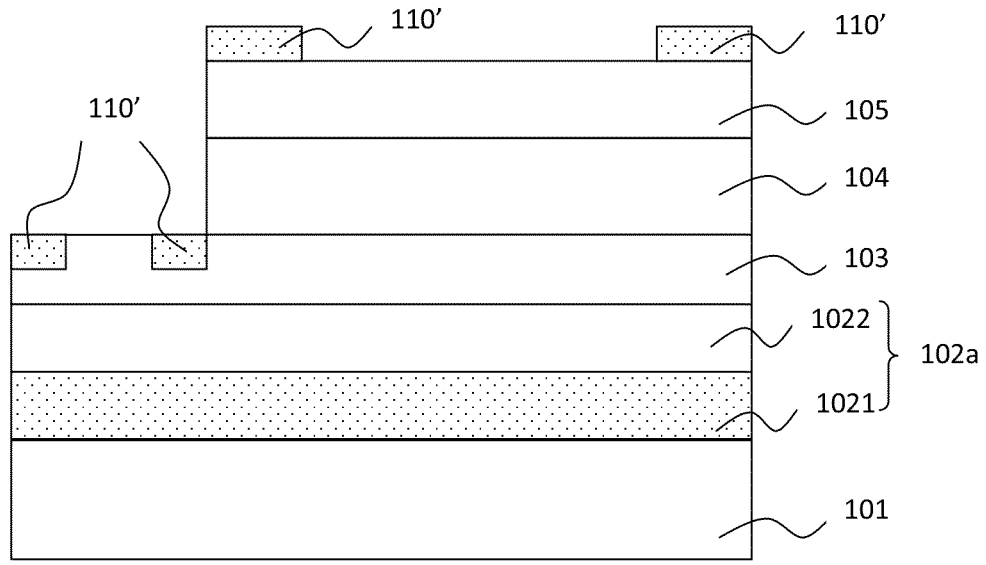

Following, as FIG. 2C shows, the passivation layer 109 is removed. A partial of the reflecting layers 110 is removed to form a plurality of reflecting islands 110'. The plurality of the reflecting islands 110' is generally electrically and thermally conductive, and designed to scatter light toward the substrate 101. The amount of scattering is determined by the thickness and porosity of the plurality of the reflecting islands 110'. The plurality of the reflecting islands 110' generally has a thickness between 0.5 microns and 40 microns. The plurality of the reflecting islands 110' may have porosity as 5%-90%, 10%-90%, 20%-90%, 30%-90%, 40%-90%, 50%-90%, 60%-90%, 70%-90%, or 80%-90%.

A suitable porosity may be related to the thickness of the plurality of the reflecting islands 110'. In order to provide the same amount of scattering, a thicker reflecting island 110' may be less porous than a thinner reflecting island 110'. The light rays reflected and scattered by the plurality of the reflecting islands 110' have a Lambertian radiation pattern with maximum intensity directed perpendicular to surface.

Figure 2D:
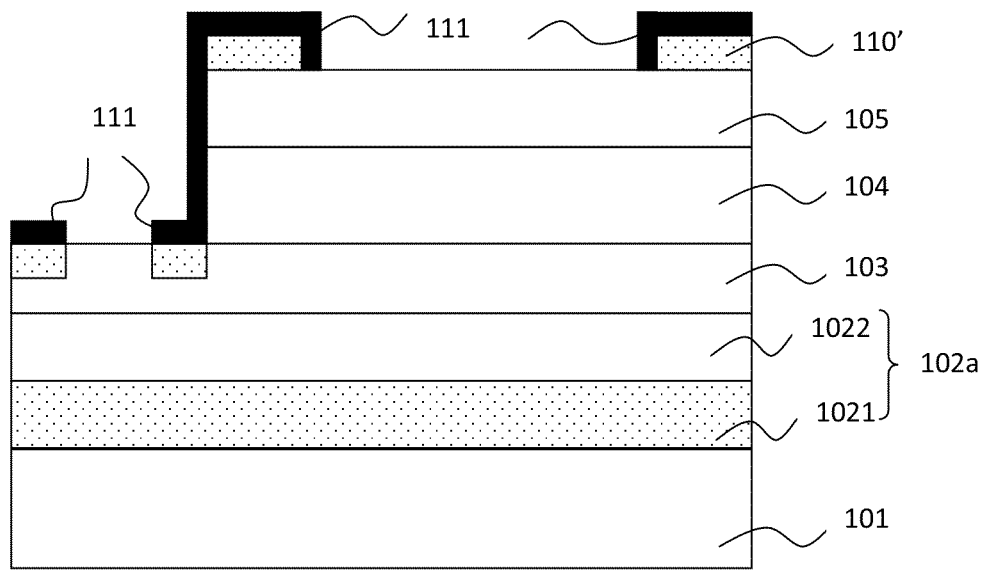
Figure 2E:
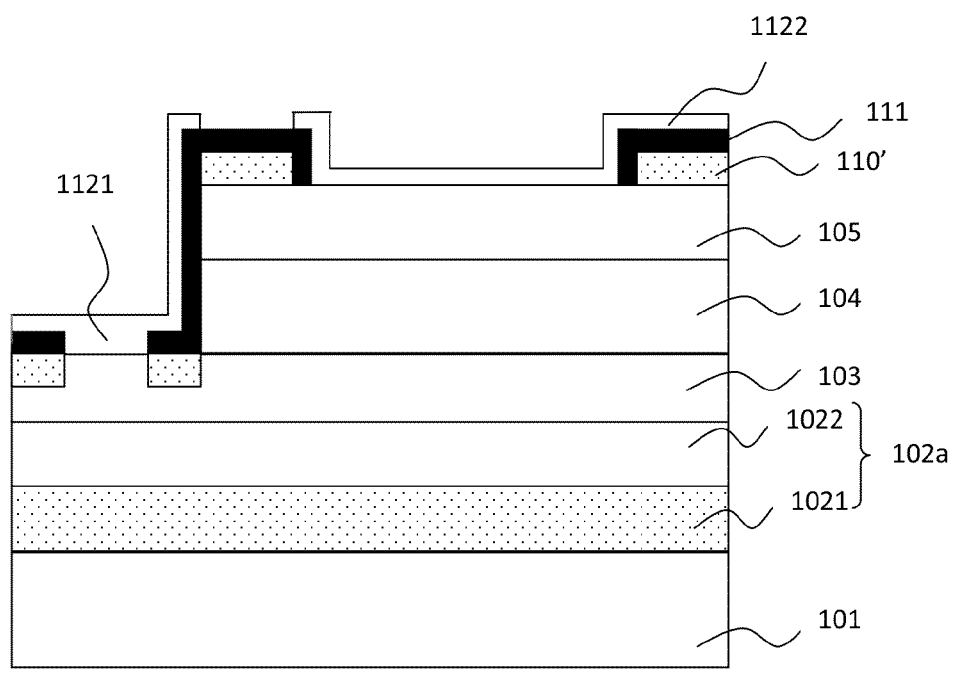

As FIGS. 2D-2E show, a dielectric layer 111 is formed on the plurality of the reflecting islands 110' and the exposed sidewall of the active layer 104 and the second conductivity semiconductor layer 105. Then a first metal reflecting layer 1121 is formed on partial of the dielectric layer 111 and the exposed first conductivity semiconductor layer 103 and the sidewall of the active layer 104 and the second conductivity semiconductor layer 105. A second metal reflecting layer 1122 is formed on partial of the dielectric layer 111 and the exposed second conductivity semiconductor layer 105. The material of the dielectric layer 111 can be single layer or multilayer contains at least one material selected from the group consisting of $SiO_2$, SiNx, $TiO_2$, and $Al_2O_3$. The material of the metal reflecting layer 112 can be single layer or multilayer, and contains at least one element selected from the group consisting of Ag, Al, Rh, Ti, and Pt, or its alloy.

Figure 2F:
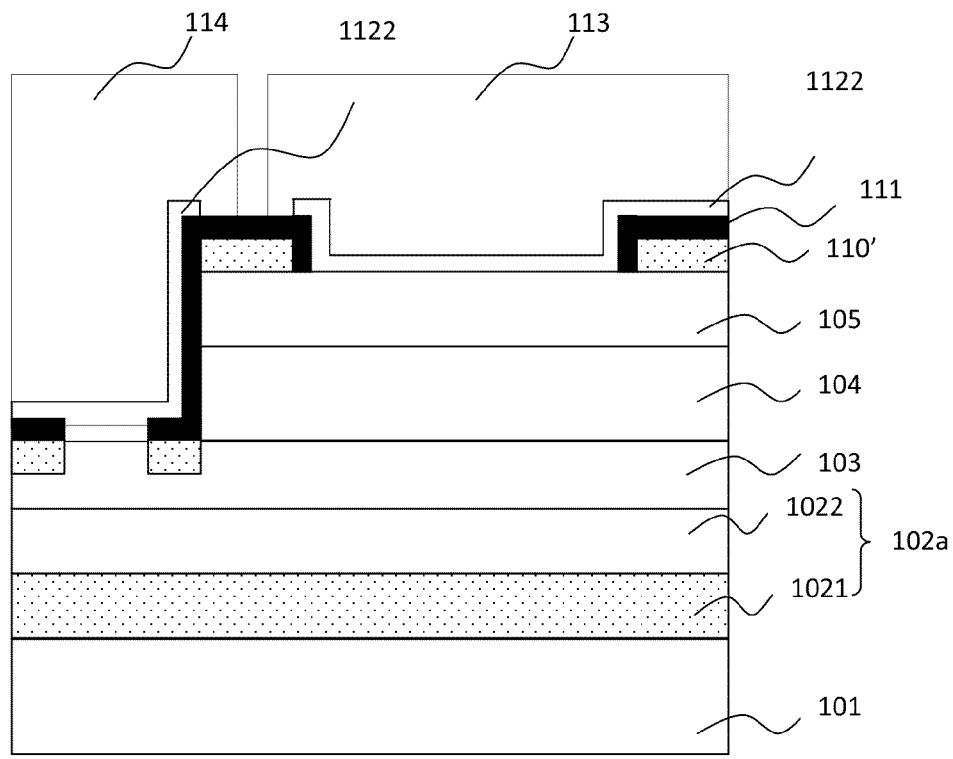

Finally, as FIG. 2F shows, a first contact 114 and a second contact 113 is formed on the first conductivity semiconductor layer 103 and the second conductivity semiconductor layer 105 separately wherein the first contact 114 and the second contact 113 may be electrically isolated by the dielectric layer 111. In one embodiment, the optoelectronic device can then be bonded on a submount to form a flip-chip structure.

Figure 2G:
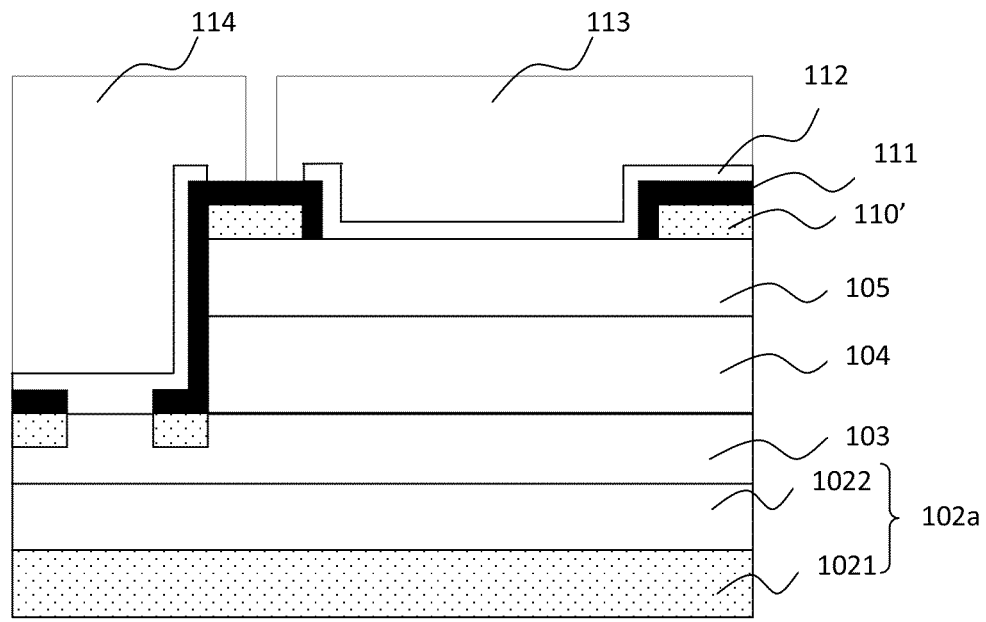

In another embodiment of this application, as FIG. 2G shows, followed by the structure as FIG. 2F, the substrate 101 can be removed by laser lift-off or other method to form a thin-film flip-chip structure.

Figure 2H:
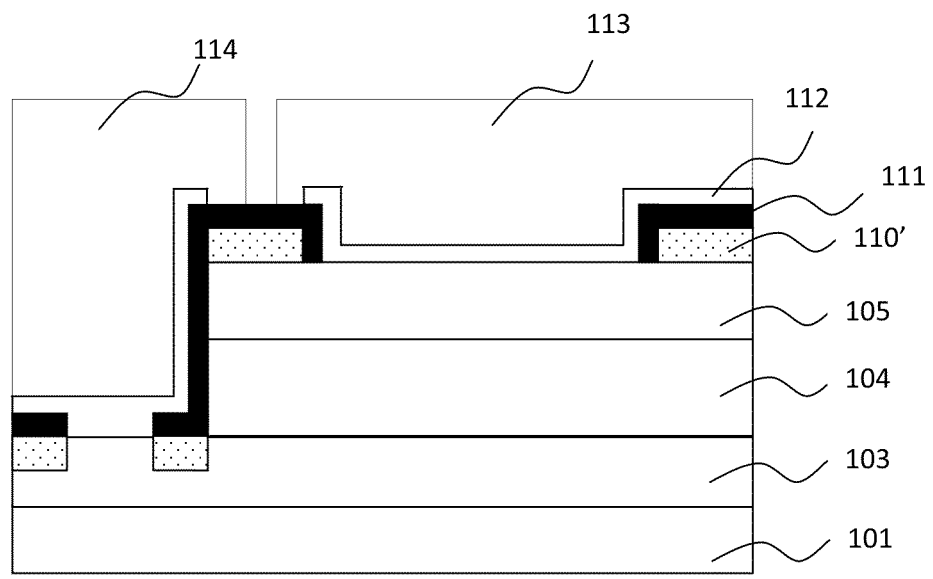

In another embodiment of this application, as FIG. 2H shows, followed by the structure as FIG. 2F, the first transition layer can be omitted during the process.

Figure 3A:
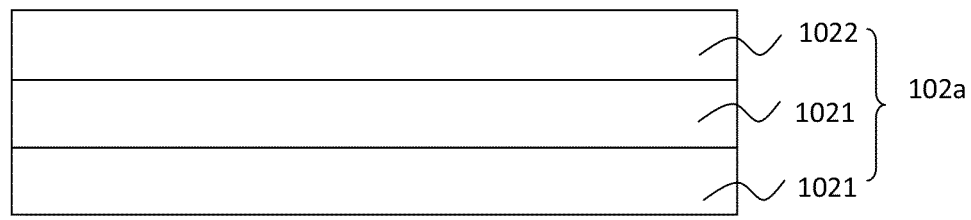
FIGS. 3A to 3C illustrate the structure of another optoelectronic device of the third embodiment in the present disclosure.
Figure 3B:
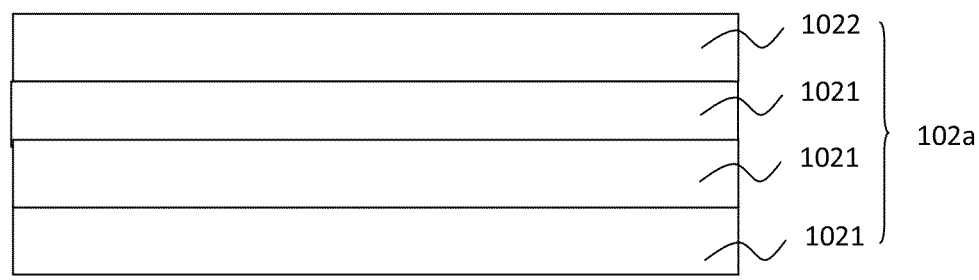
Figure 3C:
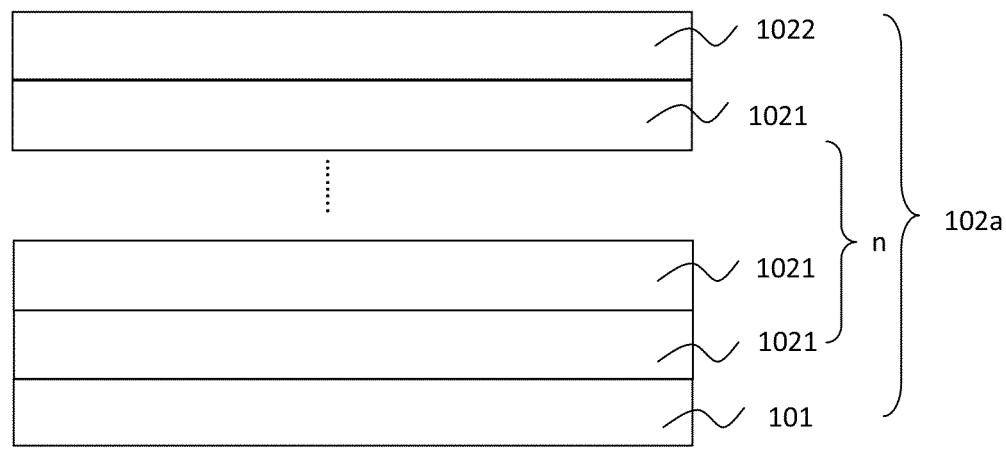

FIGS. 3A to 3C illustrate the structure of another optoelectronic device of the second embodiment in the present disclosure. As FIGS. 3A-3C shows, the first transition stack 102a can include a plurality of the first transition layers 1021 and one second transition layer 1022. As FIG. 3A shows, it can include two layers of the first transition layer 1021 formed on the substrate (no shown), and a layer of the second transition layer 1022 formed on the first transition layer 1021.

As FIG. 3B shows, it can include three layers of the first transition layer 1021 formed on the substrate (no shown) and a layer of the second transition layer 1022 formed on the top surface of the upmost layer of the first transition layer 1021. As FIG. 3C shows, by the actual design of the optoelectronic device, it can include n layers of the first transition layer 1021 formed on the substrate (no shown) and a layer of the second transition layer 1022 formed on the top surface of the upmost layer of the first transition layer 1021 wherein n≥4 to have a better optical effect or decreasing the stress. In this embodiment, each first transition layer 1021 can have the same or different doping concentration which can be $1E15-1E19$ $cm^{-3}$, $1E16-1E19$ $cm^{-3}$, $1E17-1E19$ $cm^{-3}$, $1E18-1E19$ $cm^{-3}$, $5\times1E18-1E19\,cm^{-3}$, $5\times1E17-1E19\,cm^{-3}$, or $5\times1E17-1E18$ $cm^{-3}$ and can have at least one hollow component such as pore, void, bore, pinhole, cavity, or at least two hollow components that can link into a mesh or porous structure. The fabricating method, material, size or other character is the same with the embodiment mentioned above. In one embodiment, each of the plurality first transition layers has at least one hollow component with different width, and the width of the hollow component closer to the second transition layer is smaller than the width of the hollow component closer to the substrate. In one embodiment, each of the plurality first transition layers has at least one hollow component with different width, and the width of the hollow component is decreasing from the hollow component closer to the second transition layer to the hollow component closer to the substrate.

Figure 4A:
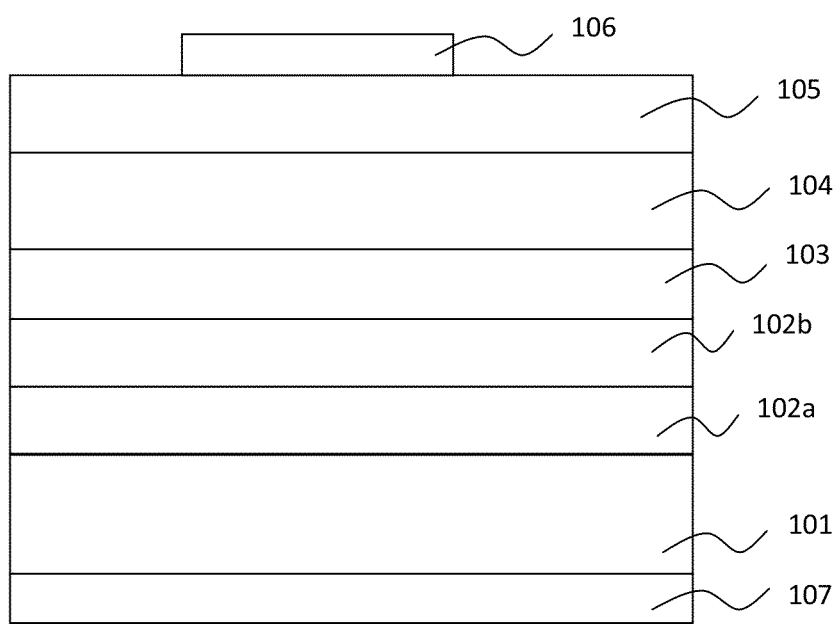
FIGS. 4A to 4C illustrate the structure of another optoelectronic device of the fourth embodiment in the present disclosure.
Figure 4B:
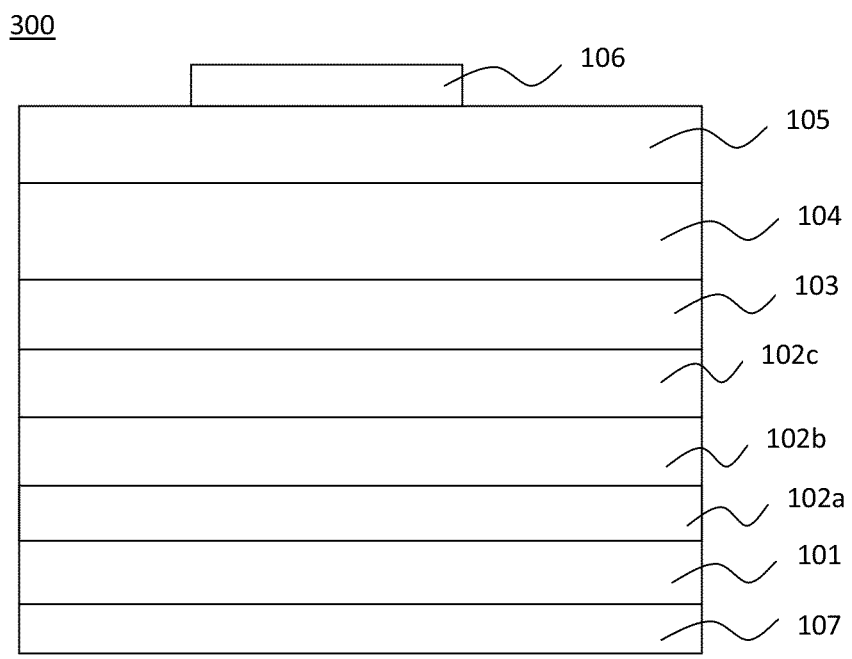
Figure 4C:
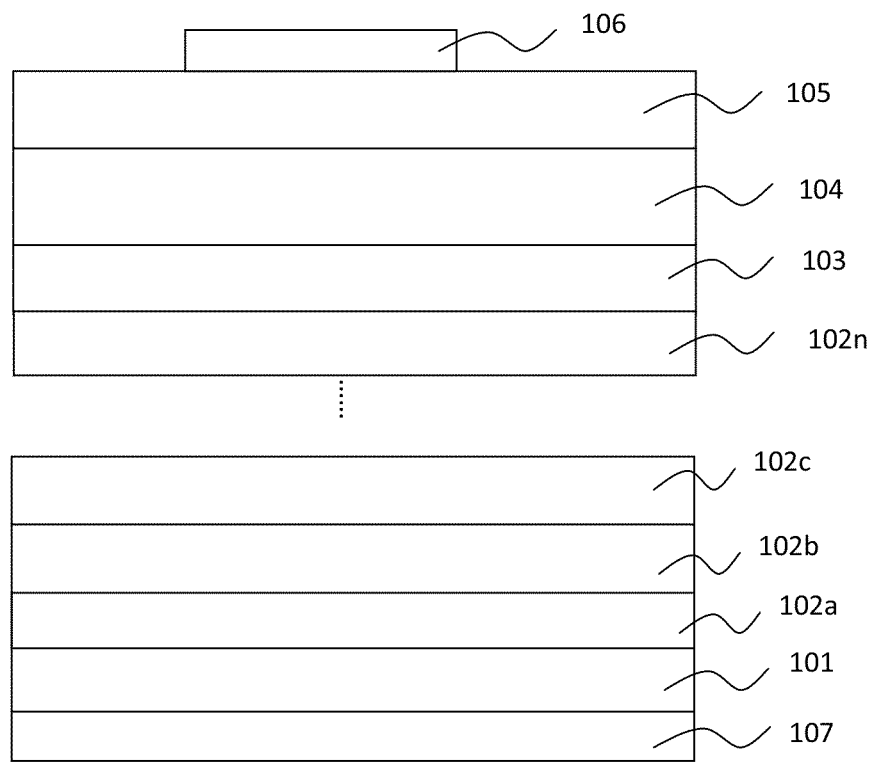
Figure 5A:
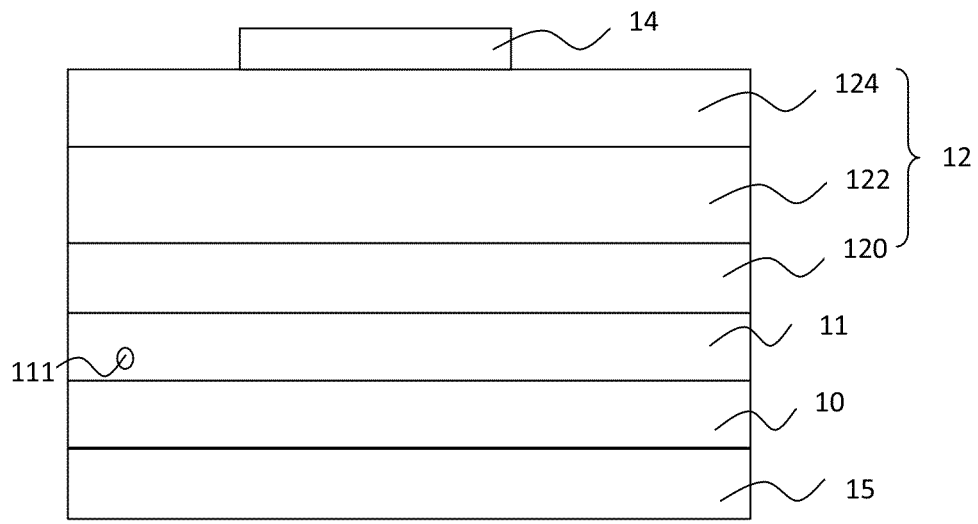
FIG. 5A illustrates the structure of a conventional light emitting device.
Figure 5B:
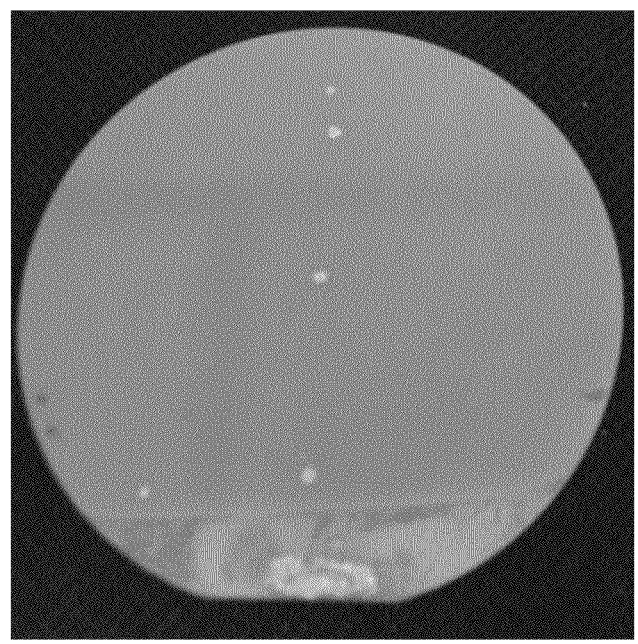
FIG. 5B illustrates the top view structure of the conventional light emitting device.

FIGS. 4A-4C illustrates the structure of another optoelectronic device of another embodiment in the present disclosure. As FIG. 4A shows, in this embodiment of the optoelectronic device 200, a second transition stack 102b can be formed on the first transition stack 102a. In this embodiment, the first transition stack 102a as the other embodiment mentioned above can include at least one layer of the first transition layer (not shown) and one layer of the second transition layer (not shown). And the second transition stack 102b can include at least one layer of the first transition layer (not shown) and one layer of the second transition layer (not shown). In another embodiment, as the other embodiment mentioned above, the first transition stack 102a and the second transition stack 102b can respectively have a plurality of first transition layers (not shown), and each first transition layer 1021 can have at least one hollow component such as pore, void, bore, pinhole, cavity, or at least two hollow components that can link into a mesh or porous structure. The fabricating method, material, size or other character is the same with the embodiment mentioned above.

As FIG. 4B shows, as another embodiment of the optoelectronic device 300, a second transition stack 102b, and a third transition stack 102c can be formed on the first transition stack 102a. In this embodiment, the first transition stack 102a as the other embodiment mentioned above can include at least one layer of the first transition layer (not shown) and one layer of the second transition layer (not shown). The second transition stack 102b can include at least one layer of the first transition layer (not shown) and one layer of the second transition layer (not shown). The third transition stack 102c can include at least one layer of the first transition layer (not shown) and one layer of the second transition layer (not shown). In another embodiment, as the other embodiment mentioned above, the first transition stack 102a can respectively have a plurality of first transition layers (not shown), and each first transition layer 1021 can have at least one hollow component such as pore, void, bore, pinhole, cavity, or at least two hollow components that can link into a mesh or porous structure. The fabricating method, material, size or other character is the same with the embodiment mentioned above.

As FIG. 4C shows, as another embodiment of the optoelectronic device 400, a second transition stack 102b, a third transition stack 102c . . . and a n transition stack 102n can be formed on the first transition stack 102a wherein n≥4. In this embodiment, each of the transition stack as the other embodiment mentioned above can include at least one layer of the first transition layer (not shown) and one layer of the second transition layer (not shown). In another embodiment, as the other embodiment mentioned above, each of the first transition stack can respectively have a plurality of first transition layers (not shown), and each first transition layer 1021 can have at least one hollow component such as pore, void, bore, pinhole, cavity, or at least two hollow components that can link into a mesh or porous structure. The fabricating method, material, size or other character is the same with the embodiment mentioned above.

Figure 6A:
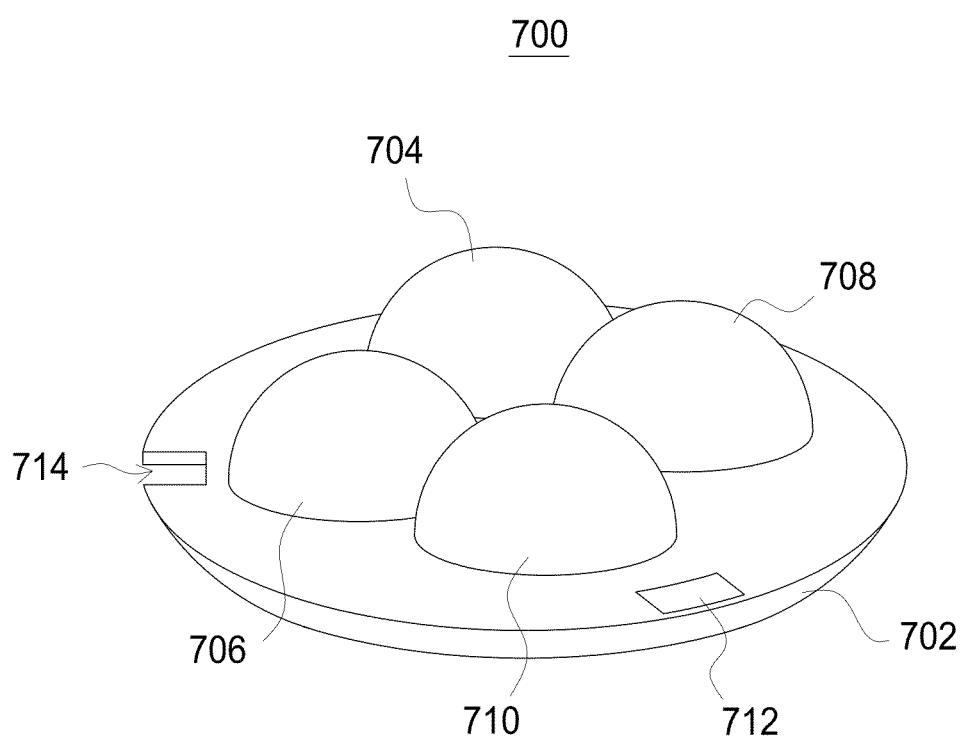
FIGS. 6A-6C illustrate an LED module of an embodiment in the present disclosure.
Figure 6B:
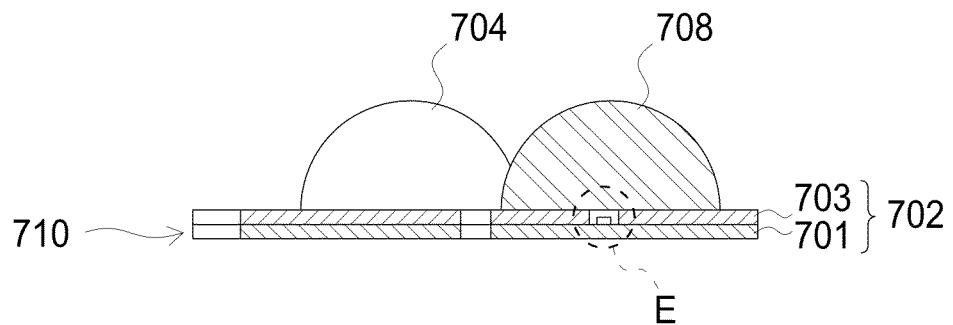
Figure 6C:
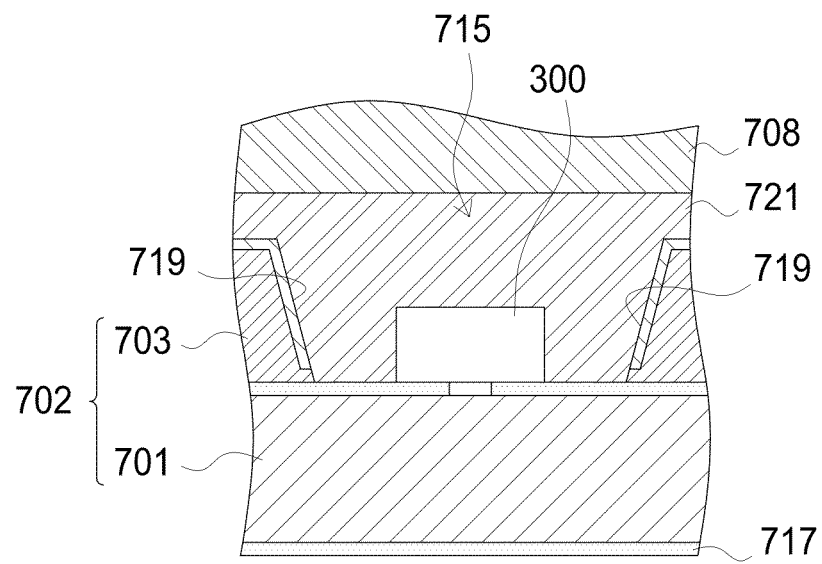

FIGS. 6A-6C illustrates an LED module of an application in the present disclosure. FIG. 6A is an external perspective view illustrating an optoelectronic device module 700 including a submount 702, an optoelectronic device (not shown) described above, a plurality of lens 704, 706, 708, 710, and two power supply terminals 712, 714. The LED module 700 is attached to a lighting unit 800 (mentioned later).

FIG. 6B is a plan view illustrating the optoelectronic device module 700, and FIG. 6C is an enlarged view illustrating a portion E shown in FIG. 6B. As FIG. 6B shows, the submount 702 including an upper subunit 703 and a lower subunit 701, and at least one surface of the lower subunit 701 is contacted with the upper subunit 703. The lens 704, 708 are formed on the upper subunit 703. At least one through hole 715 is formed on the upper subunit 703 and at least one of the optoelectronic device 300 is formed inside the through hole 715 and contacted with the lower subunit 701. Besides, the optoelectronic device 300 is encapsulated by an encapsulating material 721 wherein the material of the encapsulating material 721 may be a silicone resin, an epoxy resin or the like. And a lens 708 is optionally formed on the encapsulating material 721. In one embodiment, a reflecting layer 719 is formed on the sidewall of the through hole 715 to increase the light emitting efficiency. A metal layer 717 can be formed on the lower surface of the lower subunit 701 for improving heat dissipation.

Figure 7A:
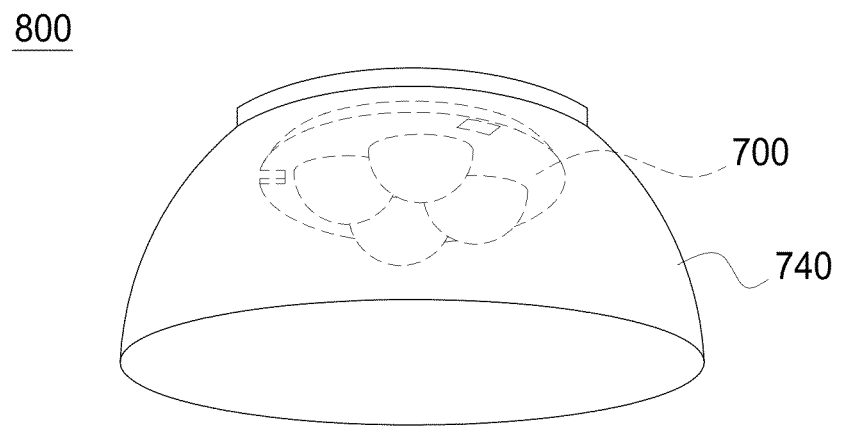
FIGS. 7A-7B illustrate a lighting apparatus of an embodiment in the present application form different perspectives.
Figure 7B:
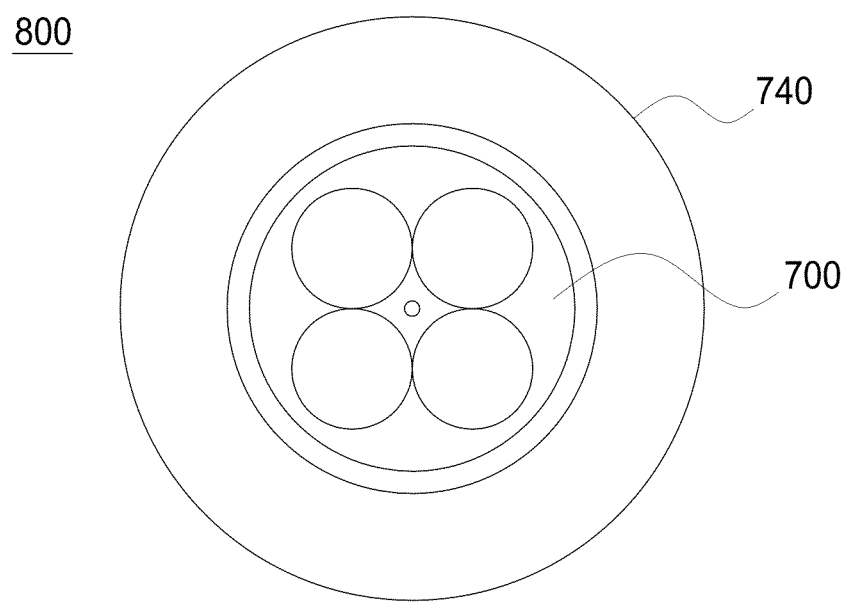

FIGS. 7A-7B illustrate a lighting apparatus of an embodiment in the present application form different perspectives. The lighting apparatus 800 includes an optoelectronic device module 700, a case 740, a power supply circuit (not shown) to supply current to the lighting apparatus 800 and a control unit (not shown) to control the power supply circuit. The lighting apparatus 800 can be an illumination device, such as street lamps, headlights or indoor illumination light source, and can be a traffic sign or a backlight module of the display panel.

Figure 8:
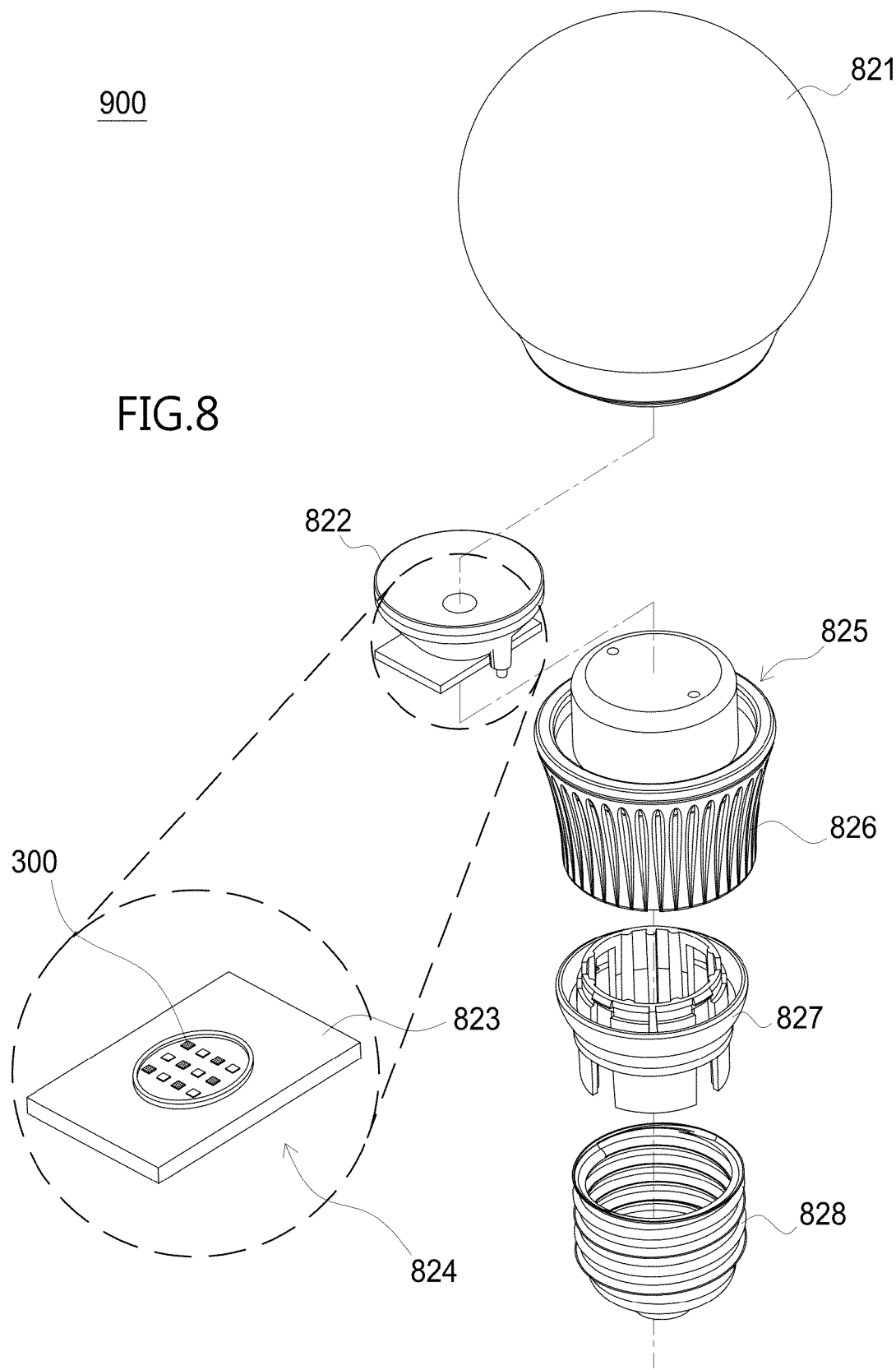
FIG. 8 is an explosive diagram of a bulb in accordance with an embodiment of the present application.

FIG. 8 shows an explosive diagram of a bulb in accordance with another application of the present application. The bulb 900 comprises a cover 821, a lens 822, a lighting module 824, a lamp holder 825, a heat sink 826, a connecting part 827, and an electrical connector 828. The lighting module 824 comprises a carrier 823 and a plurality of optoelectronic device 300 of any one of the above mentioned embodiments on the carrier 823.

Figure 9A:
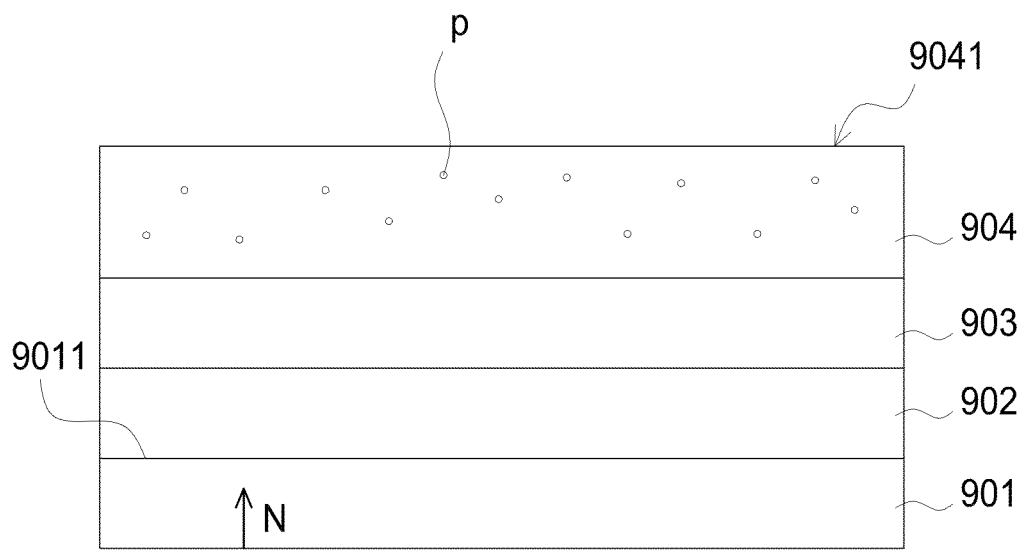
FIGS. 9A and 9B illustrate the structure of the optoelectronic device of another embodiment in the present disclosure.
Figure 9B:
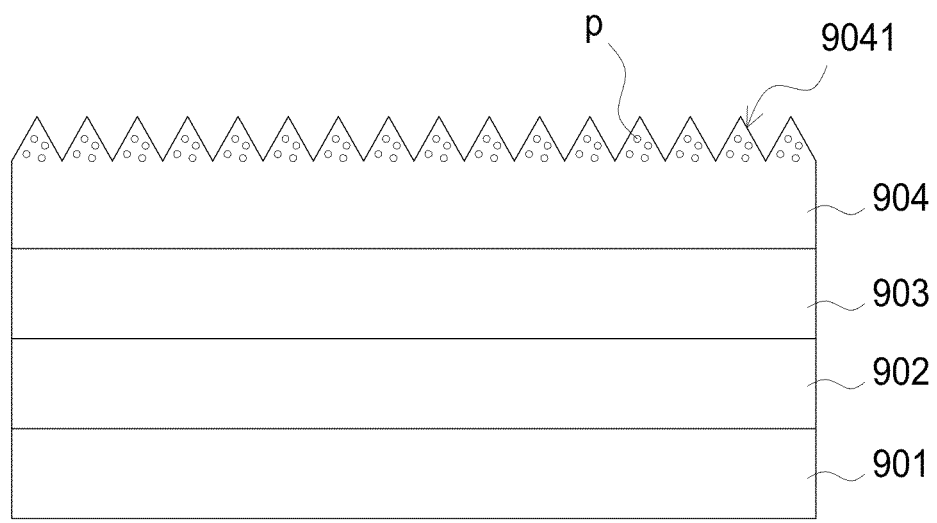

FIGS. 9A and 9B illustrate the structure of the optoelectronic device of another embodiment in the present disclosure. FIG. 9A illustrates a substrate 901, and a first conductivity semiconductor layer 902, an active layer 903, and a second conductivity semiconductor layer 904 formed in sequence on the substrate 901. In this embodiment, the upper surface 9041 of the second conductivity semiconductor layer 904 is a substantially flat surface. In another embodiment, the upper surface 9011 of the substrate 901 is a patterned surface.

In this embodiment, the second conductivity semiconductor layer 904 is co-doped with p-type impurity and n-type impurity. Each of the doping concentration of the first impurity or the second impurity is lower than $10^{22}$ cm$^{-3}$. In one embodiment, the doping concentration is 1E15–1E19 cm$^{-3}$, 1E16–1E19 cm$^{-3}$, 1E17–1E19 cm$^{-3}$, 1E18–1E19 cm$^{-3}$, 5×1E18–1E19 cm$^{-3}$, 5×1E17–1E19 cm$^{-3}$, or 5×1E17–1E18 cm$^{-3}$.

The impurity of p-type doping comprises an element selected from group IIA such as Be, Mg, Ca. The impurity of n-type doping comprises an element selected from group IVA and VIA such as Si, Ge, O, S, Te. In one embodiment, the n-type doping is performed during or after forming the second semiconductor layer 904.

In one embodiment, the method for doping the n-type impurity comprises ion implantation or mixing the impurity during the epitaxial growth of the second semiconductor layer 904. The doping temperature for doping the n-type impurity is between 800 to 1200° C. In this embodiment, the material of the first conductivity semiconductor layer 902, the active layer 903, and the second conductivity semiconductor layer 904 can be group 111 Å nitride semiconductor, group 111 Å phosphide semiconductor, GaN, AlGaInP or any other suitable materials.

Following, the second conductivity semiconductor layer 904 can be etched by the following method to form at least one first hollow component p in the second conductivity semiconductor layer 904. The first hollow component p can be pore, void, bore, pinhole, cavity, or a mesh or porous structure linked by at least two first hollow components p to form an optoelectronic device 500.

The methods include: 1) Wet etching with an aqueous solution of at least one of $H_2SO_4$, $H_3PO_4$, $H_2C_2O_4$, HCl, KOH, and NaOH, ethylene glycol solution or their mixture;

2) Electrochemical etching with an aqueous solution of at least one of $H_2SO_4$, $H_3PO_4$, $H_2C_2O_4$, HCl, KOH, and NaOH, an ethylene glycol solution or their mixture;

3) Lateral electrochemical etching with an aqueous solution of at least one of $H_2SO_4$, $H_3PO_4$, $H_2C_2O_4$, HCl, KOH, and NaOH, an ethylene glycol solution or their mixture; or 4) Dry etching such as inductive coupling plasma (ICP), reactive ion etch (RIE) by a gas containing at least one of HCl, $Cl_2$, $SF_6$, $H_2$, $BCl_3$ and $CH_4$.

In one embodiment, when the etching is performed with the electrochemical etching, the n-type impurity is chemically more reactive to the aqueous solution of the electrochemical etching than the p-type impurity. In another embodiment, the electrochemical etching step consumes a portion of the n-type impurity such that the concentration of the n-type impurity is decreased after the electrochemical etching. In one embodiment, the n-type impurity is doped at a depth from an upper surface of the second semiconductor layer 904, and the hollow component is formed about the same as the depth from the upper surface of the second semiconductor layer 904.

In this embodiment, the width of the first hollow component p is defined as the largest size of the first hollow component p perpendicular with the normal line direction N of the substrate 901.

In one embodiment, the first hollow component p can be pore, void, bore, pinhole, cavity, and the width of the first hollow component p can be 10 nm-2000 nm, 100 nm-2000 nm, 300 nm-2000 nm, 500 nm-2000 nm, 800 nm-2000 nm, 1000 nm-2000 nm, 1300 nm-2000 nm, 1500 nm-2000 nm, or 1800 nm-2000 nm.

In another embodiment, the first hollow components p can be multiple voids or porous structure. The average width of the plurality of the first hollow components p can be 10 nm-2000 nm, 100 nm-2000 nm, 300 nm-2000 nm, 500 nm-2000 nm, 800 nm-2000 nm, 1000 nm-2000 nm, 1300 nm-2000 nm, 1500 nm-2000 nm, or 1800 nm-2000 nm. In another embodiment, the average distance D of the plurality of the first hollow components p can be 10 nm-2000 nm, 100 nm-2000 nm, 300 nm-2000 nm, 500 nm-2000 nm, 800 nm-2000 nm, 1000 nm-2000 nm, 1300 nm-2000 nm, 1500 nm-2000 nm, or 1800 nm-2000 nm.

The porosity $\Phi$ of the plurality of the first hollow components p can be defined as the total volume of the first hollow component $V_v$ divided by the overall volume $V_T$ of the second semiconductor layer 904

$$\left(\phi = \frac{V_V}{V_T}\right).$$

In one embodiment, the porosity $\Phi$ of the plurality of the first hollow components p can be 5%-90%, 10%-90%, 20%-90%, 30%-90%, 40%-90%, 50%-90%, 60%-90%, 70%-90% or 80%-90%.

In one embodiment, the first hollow components p can be a regular array structure. For example, the plurality of the first hollow components p has the same size and forms a first photonic crystal structure to enhance the reflection and scattering of light. The plurality of the first hollow components p can be distributed at about a same level of height.

In one embodiment, the optoelectronic device 500 can be bonded on a submount (not shown) to form a flip-chip structure and the first hollow components p are between the submount and the substrate 901 for reflecting a light emitted from the active layer 903 toward the substrate 901.

The plurality of the first hollow components p inside the second semiconductor layer 904 are empty spaces or cavities having a refractive index and can act as an air lens. Because of the difference of the refractive index of the plurality of the first hollow components p and the second semiconductor layer 904, for example, the refractive index of the second semiconductor layer 904 is 2-3, and the refractive index of air is 1 so the light transmitting into the plurality of first hollow components p change its emitting direction to outside the optoelectronic device 500 and increases the light emitting efficiency. Besides, the plurality of the first hollow components p can be a scattering center to change the direction of the photon and decrease the total reflection.

In another embodiment, as FIG. 9B illustrated, the upper surface 9041 of the second semiconductor layer 904 has a plurality of depressions which can be formed during the epitaxial growth of the second semiconductor layer 904. A portion of the first hollow components p is exposed at sidewalls of the plurality of depressions. In another embodiment, the plurality of the first hollow components p is distributed at about a same level of height.

Figure 10A:
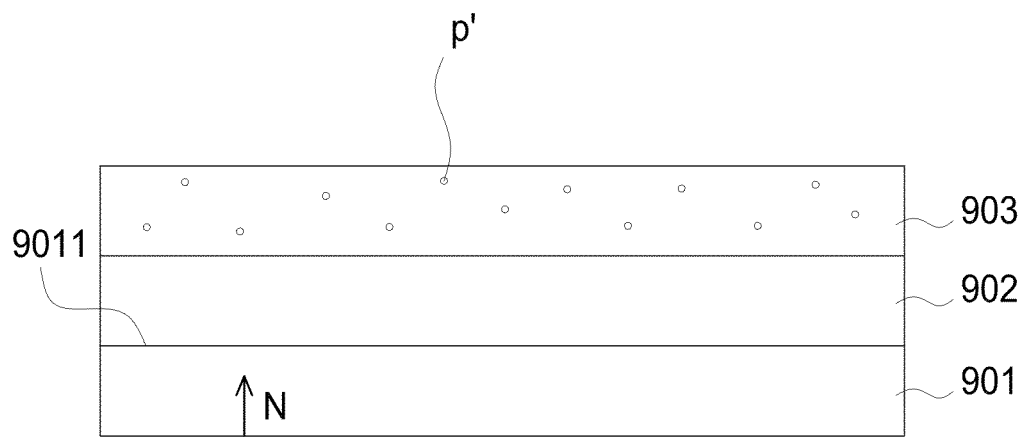
FIGS. 10A to 10B illustrate the structure of the optoelectronic device of another embodiment in the present disclosure.

FIG. 10A illustrates a substrate 901, a first conductivity semiconductor layer 902 and an active layer 903 formed on the substrate 901. The upper surface 9011 of the substrate 901 can be a patterned surface.

In this embodiment, active layer 903 is doped with an n-type impurity. The doping concentration of the n-type doping is lower than $10^{22}$ $cm^{-3}$. In one embodiment, the doping concentration is 1E15–1E19 $cm^{-3}$, 1E16–1E19 $cm^{-3}$, 1E17–E19 $cm^{-3}$, 1E18–E19 $cm^{-3}$, 5×1E18–1E19 $cm^{-3}$, 5×1E17–1E19 $cm^{-3}$, or 5×1E17–1E18 $cm^{-3}$. The impurity of n-type doping comprises an element selected from group IVA and VIA such as Si, Ge, O, S, Te, and can be doped during or after forming the active layer 903. The method for doping the n-type impurity comprises ion implantation or mixing the impurity during the epitaxial growth of the active layer 903. The doping temperature for doping the n-type impurity is between 800 to 1200° C.

In this embodiment, the material of the first conductivity semiconductor layer 902, the active layer 903, and the second conductivity semiconductor layer 904 can be group IIIA nitride semiconductor, group IIIA phosphide semiconductor, GaN, AlGaInP or any other suitable materials.

Following, the active layer 903 can be etched by the following method to form at least one second hollow component p' in the active layer 903. The second hollow component p' can be pore, void, bore, pinhole, cavity, or a mesh or porous structure linked by at least two first hollow components p to form an optoelectronic device 600.

The methods include: 1) Wet etching with an aqueous solution of at least one of $H_2SO_4$, $H_3PO_4$. $H_2C_2O_4$, HCl, KOH, and NaOH, ethylene glycol solution or their mixture;

2) Electrochemical etching with an aqueous solution of at least one of $H_2SO_4$, $H_3PO_4$, $H_2C_2O_4$, HCl, KOH, and NaOH, an ethylene glycol solution or their mixture;

3) Lateral electrochemical etching with an aqueous solution of at least one of $H_2SO_4$, $H_3PO_4$, $H_2C_2O_4$, HCl, KOH, and NaOH, an ethylene glycol solution or their mixture; or 4) Dry etching such as inductive coupling plasma (ICP), reactive ion etch (RIE) by a gas containing at least one of HCl, $Cl_2$, $SF_6$, $H_2$, $BCl_3$ and $CH_4$.

In one embodiment, when the etching is performed with the electrochemical etching, the electrochemical etching step consumes a portion of the n-type impurity such that the concentration of the n-type impurity is decreased. In one embodiment, the n-type impurity is doped at a depth from an upper surface of the active layer 903, and the second hollow component p' is formed about the same as the depth from the upper surface of the active layer 903.

In this embodiment, the width of the second hollow component p' is defined as the largest size of the second hollow component p' perpendicular with the normal line direction N of the substrate 901.

In one embodiment, the second hollow component p' can be pore, void, bore, pinhole, cavity, and the width of the second hollow component p' can be 10 nm-2000 nm, 100 nm-2000 nm, 300 nm-2000 nm, 500 nm-2000 nm, 800 nm-2000 nm, 1000 nm-2000 nm, 1300 nm-2000 nm, 1500 nm-2000 nm, or 1800 nm-2000 nm.

In another embodiment, the second hollow component p' can be multiple voids or porous structure. The average width of the plurality of the second hollow components p' can be 10 nm-2000 nm, 100 nm-2000 nm, 300 nm-2000 nm, 500 nm-2000 nm, 800 nm-2000 nm, 1000 nm-2000 nm, 1300 nm-2000 nm, 1500 nm-2000 nm, or 1800 nm-2000 nm. In another embodiment, the average distance D of the plurality of the second hollow components p' can be 10 nm-2000 nm, 100 nm-2000 nm, 300 nm-2000 nm, 500 nm-2000 nm, 800 nm-2000 nm, 1000 nm-2000 nm, 1300 nm-2000 nm, 1500 nm-2000 nm, or 1800 nm-2000 nm.

The porosity Φ of the plurality of the second hollow components p' can be defined as the total volume of the second hollow component p' $V_v$ divided by the overall volume $V_T$ of the active layer 903

$$\left(\phi = \frac{V_V}{V_T}\right).$$

In one embodiment, the porosity Φ of the plurality of the second hollow components p' can be 5%-90%, 10%-90%, 20%-90%, 30%-90%, 40%-90%, 50%-90%, 60%-90%, 70%-90% or 80%-90%.

Figure 10B:
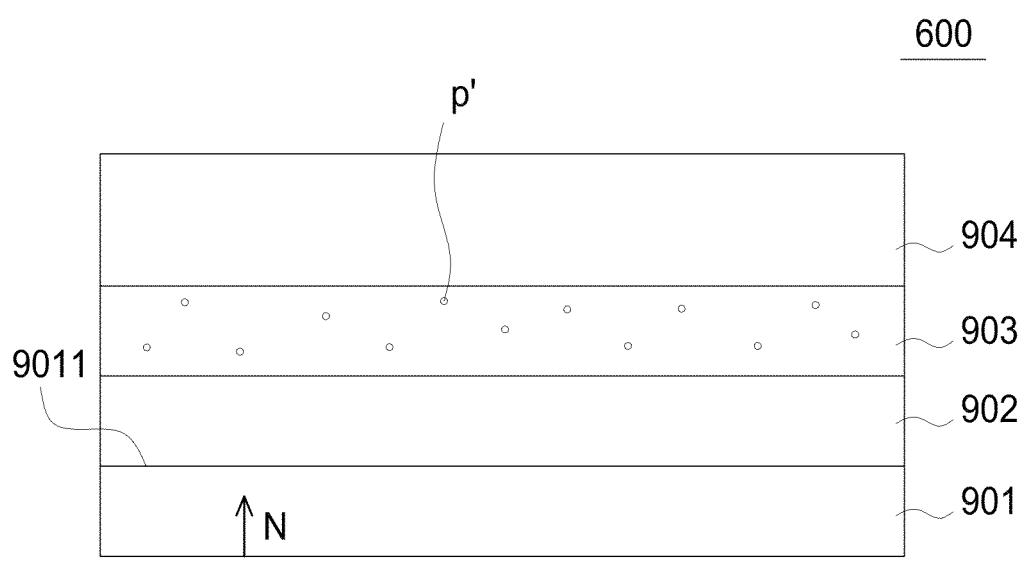

In one embodiment, the second hollow component p' can be a regular array structure. For example, the plurality of second hollow components p' has the same size and forms a second photonic crystal structure to enhance the reflection and scattering of light. The plurality of the second hollow components p' can be distributed at about a same level of height. Following, as FIG. 10B illustrated, a second conductivity semiconductor layer 904 is formed on the active layer 903 to form an optoelectronic device 600. In one embodiment, the optoelectronic device 600 can be bonded on a submount (not shown) to form a flip-chip structure and the second hollow component p' are between the submount and the substrate 901 for reflecting a light emitted from the active layer 903 toward the substrate 901.

The plurality of the second hollow component p' inside the active layer 903 is empty spaces or cavities having a refractive index and can act as an air lens. Because of the difference of the refractive index of the plurality of the second hollow component p' and the active layer 903, for example, the refractive index of the active layer 903 is 2-3, and the refractive index of air is 1 so the light transmitting into the plurality of the second hollow component p' change its emitting direction to outside the optoelectronic device 600 and increases the light emitting efficiency. Besides, the plurality of the second hollow component p' can be a scattering center to change the direction of the photon and decrease the total reflection.

Figure 11A:
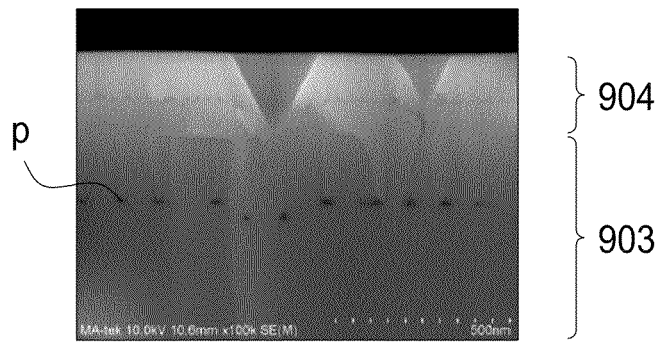
FIGS. 11A to 11C illustrate scanning electron microscope (SEM) pictures of the embodiment in the present disclosure.
Figure 11B:
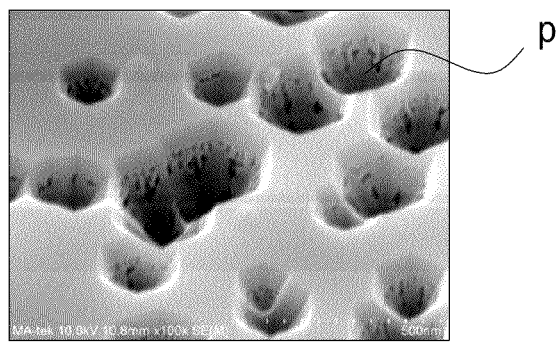
Figure 11C:
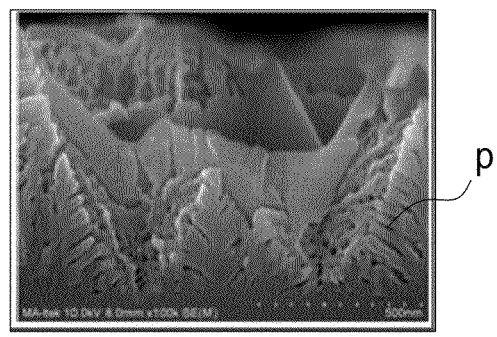

FIGS. 11A to 11C, illustrate scanning electron microscope (SEM) pictures of the embodiment in the present disclosure. FIG. 11A illustrates a scanning electron microscope (SEM) picture of the cross-sectional view of the first hollow component p formed inside the active layer 903. In this picture, the plurality of the first hollow components p is distributed at about a same level of height.

FIG. 11B illustrates a scanning electron microscope (SEM) picture of the top view of the first hollow component p formed inside the second conductivity semiconductor layer 904. In this picture, the plurality of the first hollow components p is exposed at sidewalls of the plurality of depressions of the second conductivity semiconductor layer 904.

FIG. 11C illustrates a scanning electron microscope (SEM) picture of the top view of the first hollow component p formed inside the second conductivity semiconductor layer 904. In this picture, at least two first hollow components p are linked into a mesh or porous structure and are exposed at sidewalls of the plurality of depressions of the second conductivity semiconductor layer 904.

Specifically, the optoelectronic device 100, 100', 200, 300, 400, 500, 500', 600 comprises light-emitting diode (LED), photodiode, photo resister, laser diode, infrared emitter, organic light-emitting diode and solar cell. The substrate 101, 901 can be a growing or carrying base. The material of the substrate 101, 901 comprises an electrically conductive substrate, electrically insulating substrate, transparent substrate, or opaque substrate. The material of the electrically conductive substrate can be metal such as Ge and GaAs, oxide such as $LiAlO_2$ and ZnO, nitrogen compound such as GaN and AlN, phosphide such as InP, silicon compound such as SiC, or Si. The material of the transparent substrate can be chosen from sapphire ($Al_2O_3$), $LiAlO_2$, ZnO, GaN, AlN, glass, diamond, CVD diamond, diamond-like carbon (DLC), spinel ($MgAl_2O_3$), $SiO_x$, or $LiGaO_2$.

The first semiconductor layer 103, 902 and the second semiconductor layer 105, 904 are different in electricity, polarity or dopant, or are the different semiconductor materials used for providing electrons and holes, wherein the semiconductor material can be single semiconductor material layer or multiple semiconductor material layers. The polarity can be chosen from any two of p-type, n-type and i-type. The active layer 102, 903 is disposed between the first semiconductor layer 103, 902 and the second semiconductor layer 105, 904 respectively where the electrical energy and the light energy can be converted or stimulated converted. The devices which can convert or stimulated convert the electrical energy into the light energy can be light-emitting diode, liquid crystal display, and organic light-emitting diode. The devices which can convert or be stimulatively converted the light energy into the electrical energy can be solar cell and optoelectronic diode. The material of the first semiconductor layer 103, 902 the active layer 104, 903 and the second semiconductor layer 105, 904 comprises Ga, Al, In, As, P, N, Si, and the combination thereof such as aluminum gallium indium phosphide (AlGaInP) series material, aluminum gallium indium nitride (AlGaInN) series material and so on.

The optoelectronic device of another embodiment in the application is a light-emitting diode, of which the light spectrum can be adjusted by changing the essentially physical or chemical factor of the single semiconductor material layer or the multiple semiconductor material layers. The material of the single semiconductor material layer or the multiple semiconductor material layers can contain elements selected from Al, Ga, In, P, N, Zn, O, or the combination thereof such as aluminum gallium indium phosphide (AlGaInP) series material, aluminum gallium indium nitride (AlGainN) series material and so on. The structure of the active layer 103, 902 can be single heterostructure (SH), double heterostructure (DH), double-side double heterostructure (DDI) or multi-quantum well (MQW), wherein the wavelength of the light emitted from the active layer 103, 902 can be changed by adjusting the number of the pairs of MQW.

In one embodiment of the application, a buffer layer (not shown) can be selectively disposed between the substrate 101, 901 and the first semiconductor layer 103, 902. The buffer layer is between the two material systems to transit the material system of the substrate 101, 901 to the material system of the first semiconductor layer 103, 902. For the structure of the light-emitting diode, the buffer layer is used to reduce the crystal mismatch between two materials. On the other hand, the buffer layer comprises a single layer, multiple layers or a structure which comprises two materials or two separated structures. The material of the buffer layer can be selected from organic material, inorganic material, metal or semiconductor material. The structure of the buffer layer can be a reflector layer, a thermally conductive layer, an electrically conductive layer, an ohmic contact layer, an anti-deformation layer, a stress release layer, a bonding layer, a wavelength conversion layer or a mechanically fixing structure. In one embodiment, the material of the buffer layer can be AlN or GaN, and the buffer layer can be formed by sputtering or atomic layer deposition (ALD).

A contacting layer (not shown) can be selectively formed on the second semiconductor layer 105, 904. The contacting layer is disposed on the side of the second semiconductor layer 105, 904 away from the active layer 104, 903. Specifically, the contacting layer can be optical layer, electrical layer, or the combination thereof. The optical layer can change the radiation or the light from or entering the active layer 104, 903, wherein the optical layer can change but not limited to the frequency, the wavelength, the intensity, the flux, the efficiency, the color temperature, rendering index, light field, angle of view. The electrical layer can change the value, density, distribution of voltage, resistor, current and capacitance of any two relative sides of the contacting layer. The material of the contacting layer comprises oxide such as conductive oxide, transparent oxide and the oxide with the transparency over 50%, metal such as transparent metal and the metal with transparency over 50%, organic material, inorganic material, fluoresce material, ceramic, semiconductor material and doping semiconductor material. In some applications, the material of the contacting layer can be selected from InTiO, CdSnO, SbSnO, InZnO, ZnAlO or ZnSnO. If the material of the contacting layer is transparent metal, the thickness of the contacting layer is in a range of 0.005 µm~0.6 µm.

It will be apparent to those having ordinary skill in the art that various modifications and variations can be made to the devices in accordance with the present disclosure without departing from the scope or spirit of the disclosure. In view of the foregoing, it is intended that the present disclosure covers modifications and variations of this disclosure provided they fall within the scope of the following claims and their equivalents.

Although the drawings and the illustrations above are corresponding to the specific embodiments individually, the element, the practicing method, the designing principle, and the technical theory can be referred, exchanged, incorporated, collocated, coordinated except they are conflicted, incompatible, or hard to be put into practice together.

Although the present application has been explained above, it is not the limitation of the range, the sequence in practice, the material in practice, or the method in practice. Any modification or decoration for present application is not detached from the spirit and the range of such.

What is claimed is:

1. An optoelectronic device comprising:
   a substrate; and
   an epitaxial stack including a first semiconductor layer having a first conductivity-type impurity, an active layer, and a second semiconductor layer having a second conductivity-type impurity formed in sequence on the substrate;
   a hollow component formed inside the active layer or the second semiconductor layer, wherein the layer with the hollow component is doped with an additional impurity.

2. The optoelectronic device of claim 1, wherein the additional impurity being the first conductivity-type impurity.

3. The optoelectronic device of claim 1, further comprising a plurality of hollow components formed inside the active layer or the second semiconductor layer, wherein the width of one of the plurality of hollow components is between 10 nm and 2000 nm and/or the porosity of the plurality of hollow components is between 5% and 90%.

4. The optoelectronic device of claim 1, wherein the material of the first semiconductor layer, the active layer, and the second semiconductor layer contains group IIIA nitride semiconductor or group IIIA phosphide semiconductor.

5. The optoelectronic device of claim 1, wherein the second conductivity-type impurity comprise an element selected from group IIA and the additional impurity and the first conductivity-type impurity comprises an element selected from groups IVA and VIA.

6. The optoelectronic device of claim 1, wherein the doping concentration of the additional impurity is between 1E15 and 1E19 $cm^{-3}$.

7. The optoelectronic device of claim 1, wherein the upper surface of the second semiconductor layer has a plurality of depressions and a portion of the hollow component are exposed at sidewalls of the plurality of depressions.

8. The optoelectronic device of claim 1, wherein the plurality of hollow components is distributed at about a same level of height.

9. The optoelectronic device of claim 1, further comprising a submount, wherein the hollow component is between the submount and the substrate for reflecting a light emitted from the active layer toward the substrate.

10. A method of fabricating an optoelectronic device, comprising:
    providing a substrate;
    forming a first semiconductor layer having a first conductivity-type impurity on the substrate;
    forming an active layer on the first semiconductor layer;
    forming a second semiconductor layer having a second conductivity-type impurity;
    doping an additional impurity into at least one of the second semiconductor layer and the active layer; and
    forming a hollow component inside the second semiconductor layer and/or the active layer.

11. The method of fabricating an optoelectronic device of claim 10, wherein the method for forming the hollow component comprises electrochemical etching at least one of the second semiconductor layer and the active layer.

12. The method of fabricating an optoelectronic device of claim 11, wherein the electrochemical etching is performed with an aqueous solution comprising one solution selected from $H_2SO_4$, $H_3PO_4$, $H_2C_2O_4$, HCl, KOH, NaOH, ethylene glycol solution, and their mixture.

13. The method of fabricating an optoelectronic device of claim 10, wherein the second conductivity-type impurity comprise an element selected from group IIA and the additional impurity and the first conductivity-type impurity comprises an element selected from groups IVA and VIA.

14. The method of fabricating an optoelectronic device of claim 10, wherein forming the second semiconductor layer comprises epitaxially growing the second semiconductor layer, and the plurality of depressions is formed during the growth of the second semiconductor layer.

15. The method of fabricating an optoelectronic device of claim 10, wherein the additional impurity is chemically more reactive to the aqueous solution of the electrochemical etching than the second conductivity-type impurity.

16. The method of fabricating an optoelectronic device of claim 15, wherein the electrochemical etching step consumes a portion of the additional impurity such that the concentration of the additional impurity is decreased after the electrochemical etching.

17. The method of fabricating an optoelectronic device of claim 10, wherein the additional impurity is doped at a depth from an upper surface of the second semiconductor layer, and the hollow component is formed about the same as the depth from the upper surface of the second semiconductor layer.

18. The method of fabricating an optoelectronic device of claim 10, wherein the additional impurity is doped during or after forming the second semiconductor layer.

19. The method of fabricating an optoelectronic device of claim 18, wherein the method for doping the additional impurity comprises ion implantation.

20. The method of fabricating an optoelectronic device of claim 10, wherein the doping temperature for doping the additional impurity is between 800 to 1200° C.

* * * * *